United States Patent
Lee et al.

(10) Patent No.: US 12,482,658 B2
(45) Date of Patent: Nov. 25, 2025

(54) CONDUCTIVE FEATURES OF SEMICONDUCTOR DEVICES AND METHODS OF FORMING THE SAME

(71) Applicant: Taiwan Semiconductor Manufacturing Co., Ltd., Hsinchu (TW)

(72) Inventors: Yu Shan Lee, Taichung (TW); Fa-Wei Huang, Taichung (TW); Yu-Shao Cheng, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 641 days.

(21) Appl. No.: 17/704,435

(22) Filed: Mar. 25, 2022

(65) Prior Publication Data
US 2023/0008315 A1    Jan. 12, 2023

Related U.S. Application Data

(60) Provisional application No. 63/219,921, filed on Jul. 9, 2021.

(51) Int. Cl.
  *H01L 21/28*   (2025.01)
  *C23C 16/14*   (2006.01)
  (Continued)

(52) U.S. Cl.
  CPC ........ *H01L 21/28088* (2013.01); *C23C 16/14* (2013.01); *C23C 16/45525* (2013.01);
  (Continued)

(58) Field of Classification Search
  CPC ......... C23C 16/45525; H01L 29/66545; H01L 29/66795
  See application file for complete search history.

(56) References Cited

U.S. PATENT DOCUMENTS

2004/0202786 A1*   10/2004   Wongsenakhum ........................ C23C 16/0281
                                                                                427/250
2009/0053893 A1*    2/2009   Khandelwal ...... H01L 21/28562
                                                                                257/E21.17

(Continued)

FOREIGN PATENT DOCUMENTS

CN   105336784 A   2/2016
CN   107039271 A   8/2017
(Continued)

OTHER PUBLICATIONS

G. Wang et. al., "Application of Atomic Layer Deposition Tungsten (ALD W) as Gate Filling Metal for 22 nm and Beyond Nodes CMOS Technology", ECS J. Solid State Science and Tech. 3, pp. 82-85 (2014) (Year: 2014).*

*Primary Examiner* — Britt D Hanley
*Assistant Examiner* — Victor V Barzykin
(74) *Attorney, Agent, or Firm* — Slater Matsil, LLP

(57) ABSTRACT

A method of forming a semiconductor device includes forming a first layer over a substrate in a deposition chamber with a first deposition cycle and forming a second layer over the substrate in the deposition chamber with a second deposition cycle. The first deposition cycle includes flowing a first process gas over the substrate and flowing a second process gas over the substrate. The second deposition cycle includes flowing a third process gas over the substrate and flowing a fourth process gas over the substrate.

20 Claims, 29 Drawing Sheets

(51) Int. Cl.
*C23C 16/455* (2006.01)
*H10D 30/01* (2025.01)
*H10D 30/62* (2025.01)
*H10D 64/01* (2025.01)
*H10D 64/66* (2025.01)
H10D 30/69 (2025.01)
H10D 62/822 (2025.01)

(52) U.S. Cl.
CPC ....... *H10D 30/024* (2025.01); *H10D 30/6211* (2025.01); *H10D 64/017* (2025.01); *H10D 64/667* (2025.01); H10D 30/797 (2025.01); H10D 62/822 (2025.01)

(56) References Cited

U.S. PATENT DOCUMENTS

| | | | |
|---|---|---|---|
| 2015/0228543 A1 | 8/2015 | Yu et al. | |
| 2015/0262939 A1 | 9/2015 | Sakata | |
| 2017/0283942 A1 | 10/2017 | Suzuki et al. | |
| 2018/0053660 A1* | 2/2018 | Jandl | H01L 21/28568 |
| 2018/0175201 A1 | 6/2018 | Wang et al. | |
| 2019/0157409 A1 | 5/2019 | Wang et al. | |
| 2020/0044048 A1 | 2/2020 | Yu et al. | |
| 2021/0119013 A1 | 4/2021 | Chen et al. | |
| 2022/0364232 A1* | 11/2022 | Nannapaneni | C23C 16/08 |

FOREIGN PATENT DOCUMENTS

| | | | |
|---|---|---|---|
| KR | 20080092554 A | 10/2008 | |
| TW | 201818458 A | 5/2018 | |

* cited by examiner

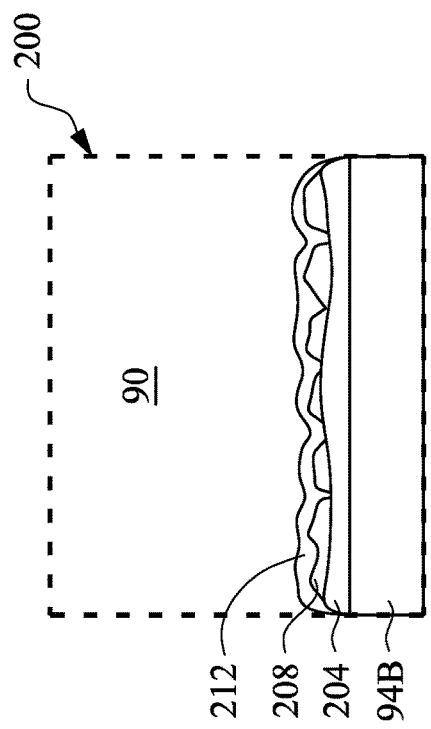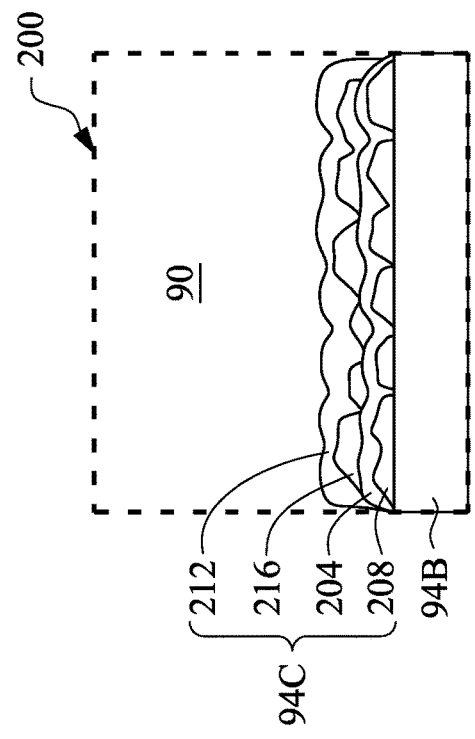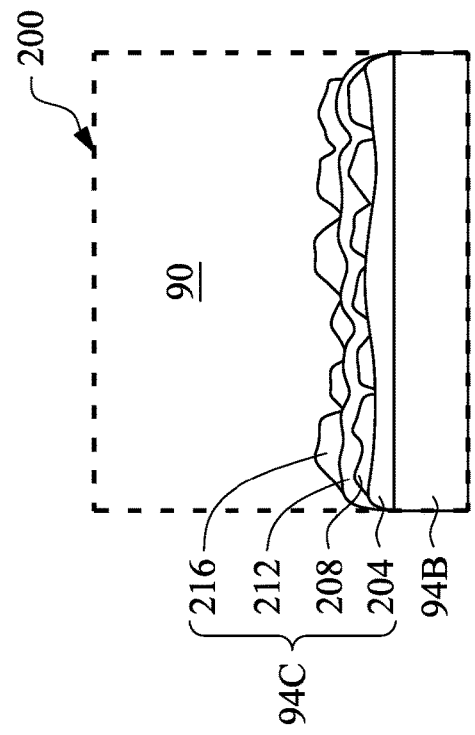

US 12,482,658 B2

CONDUCTIVE FEATURES OF SEMICONDUCTOR DEVICES AND METHODS OF FORMING THE SAME

PRIORITY CLAIM AND CROSS-REFERENCE

This application claims the benefit of U.S. Provisional Application No. 63/219,921, filed on Jul. 9, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15, 16, 17, 19, 21, 22, 23, 24A, 24B, 24C, 27A, 27B, 27C, 28A, 28B, 29A, and 29B are cross-sectional views of intermediate stages in the manufacturing of FinFETs, in accordance with some embodiments.

DETAILED DESCRIPTION

Figure 1:
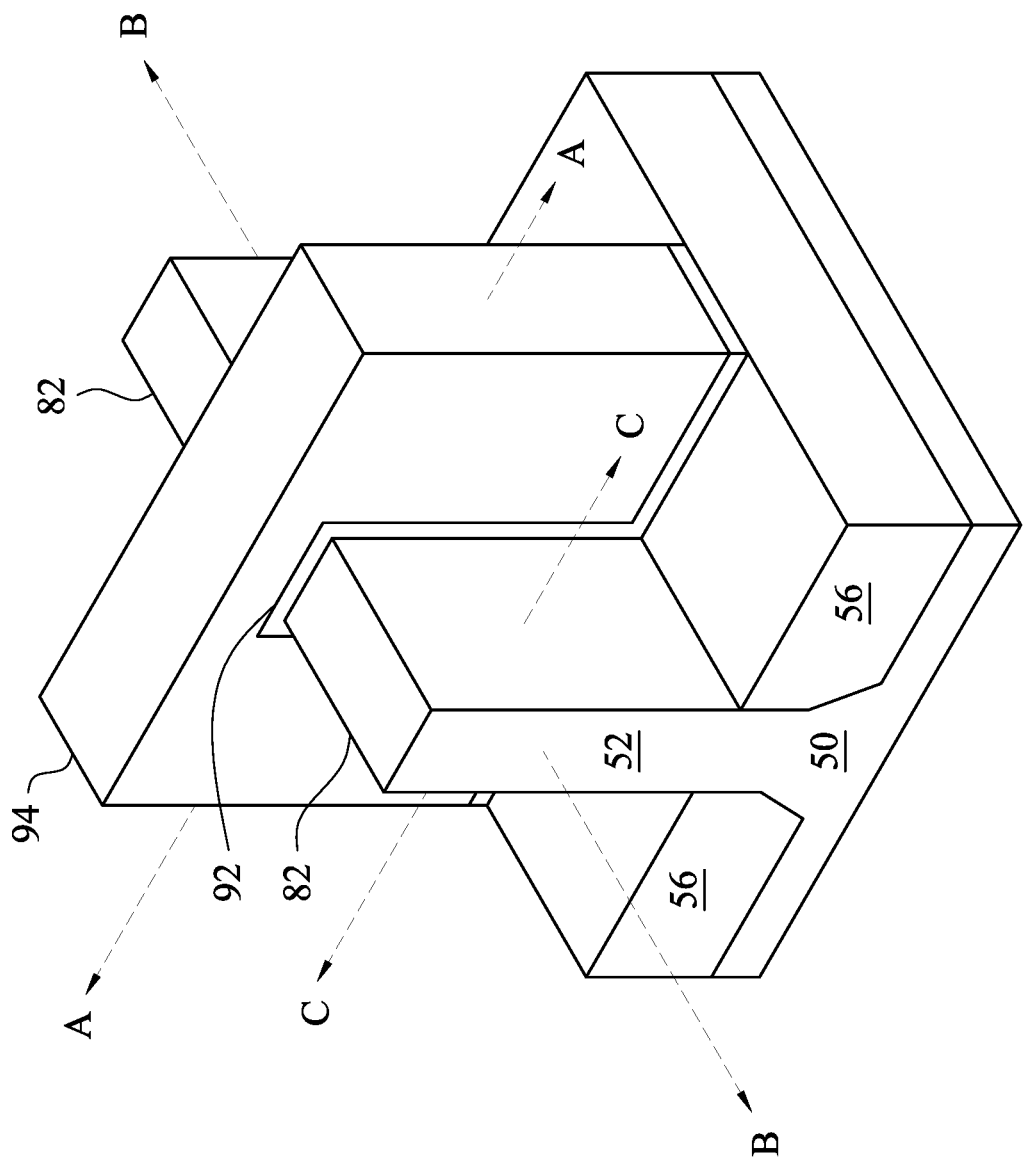
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a conductive material (e.g. tungsten) is formed as a fill material of a gate electrode to fill a recess. An alternating cyclical atomic layer deposition (ALD) process forms the conductive material with a smoother surface that provides better gap-filling capability for filling the gate recess while retaining low resistance. The alternating cyclical ALD process is performed by alternating a first ALD cycle with a second ALD cycle. The first ALD cycle includes flowing a process gas comprising tungsten and a process gas comprising boron to produce a base nucleation layer for a tungsten film with a smoother surface and better gap-filling capability. The second ALD cycle includes flowing a process gas comprising tungsten and a process gas comprising silicon to produce a base nucleation layer for a tungsten film with lower resistance, providing improved device performance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 17, 19, 21 through 24C, and 27A through 29B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 24A, 27A, 28A, and 29A are illustrated along reference cross-section A-A illustrated in FIG. 1, and FIGS. 8B, 9B, 10B, 11B, 12B, 13B, 14B, 14C, 15, 16, 17, 19, 21, 22, 23, 24B, 24C, 27B, 27C, 28B, and 29B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
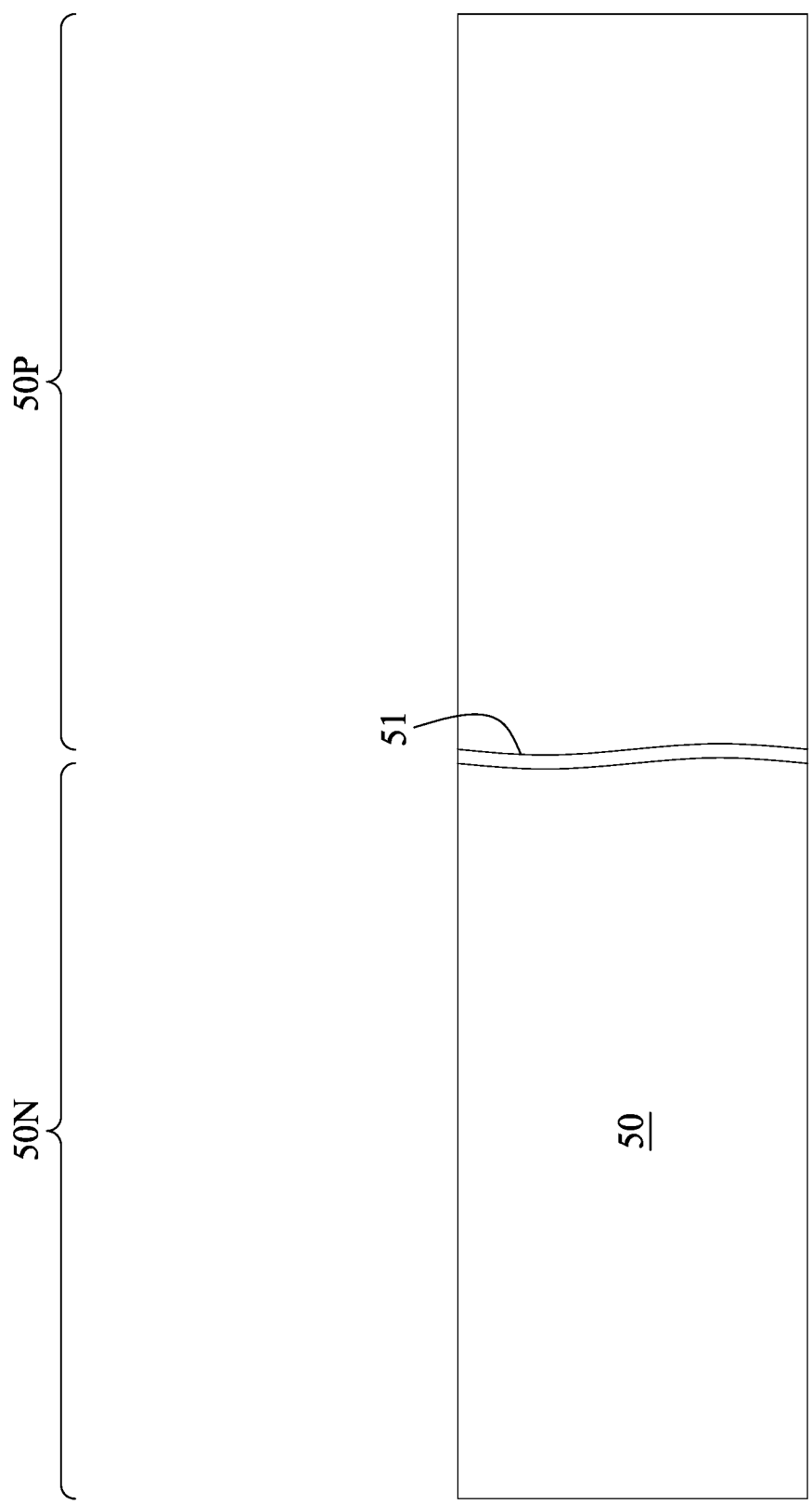

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
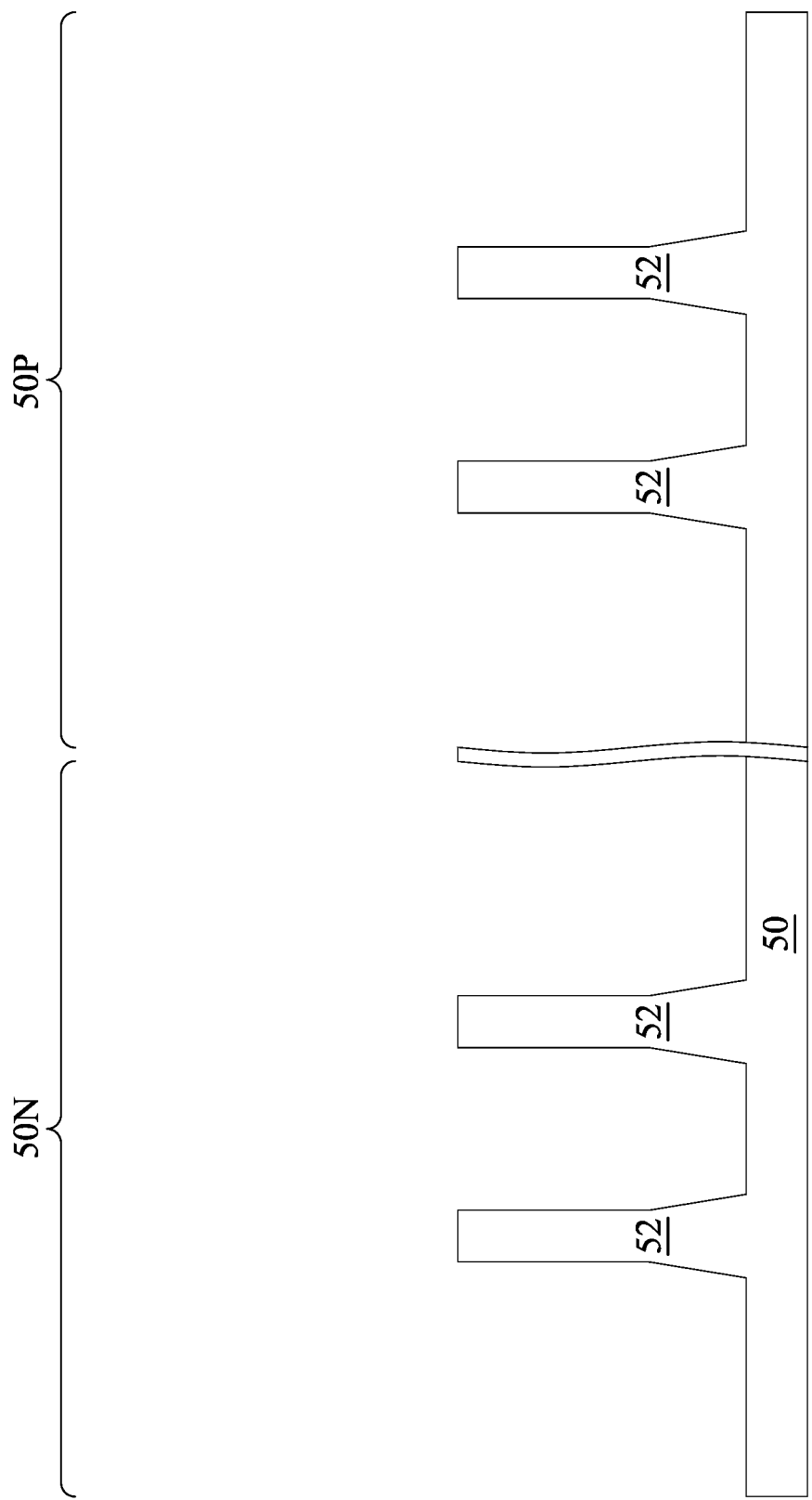

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
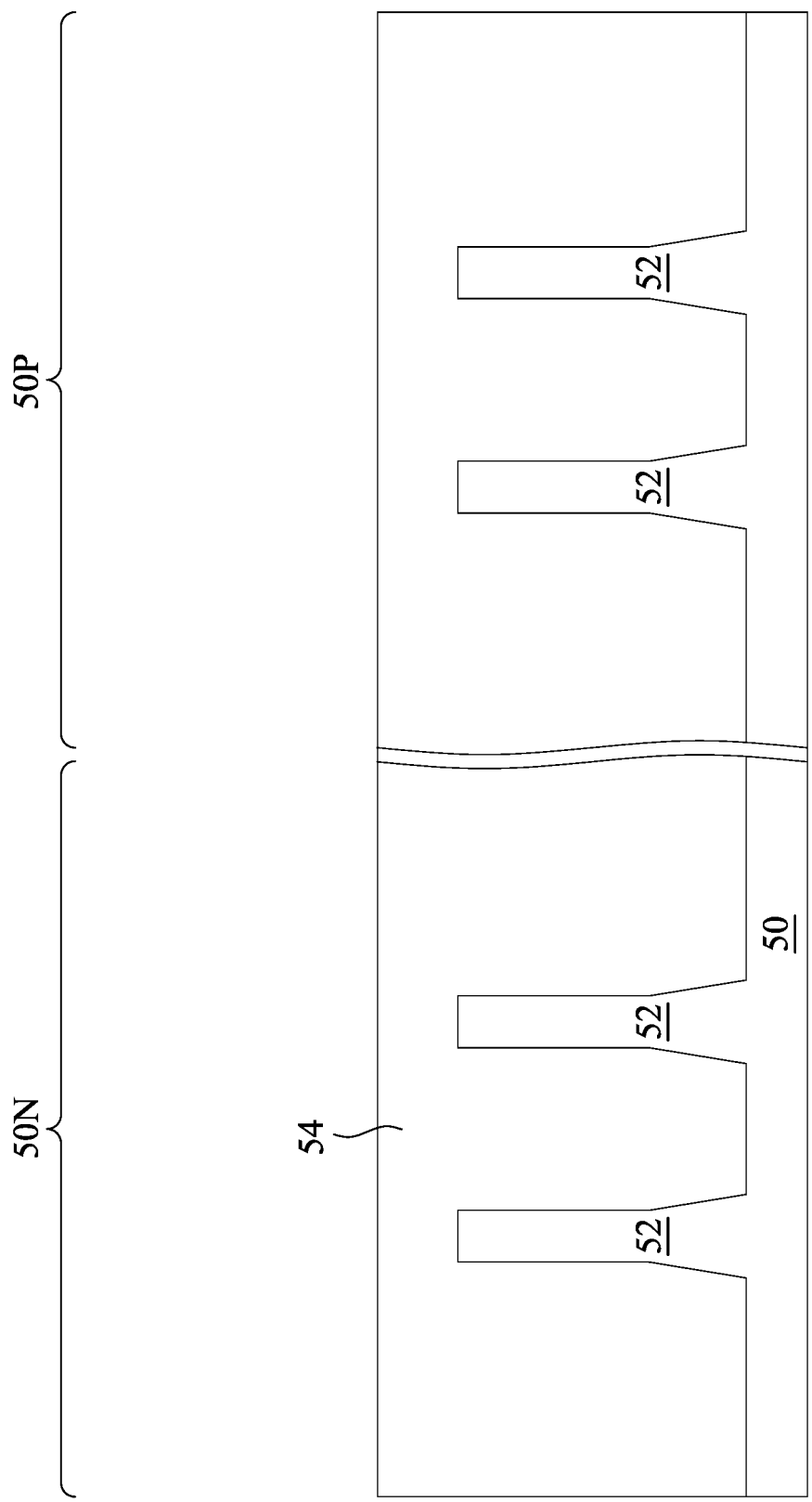

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
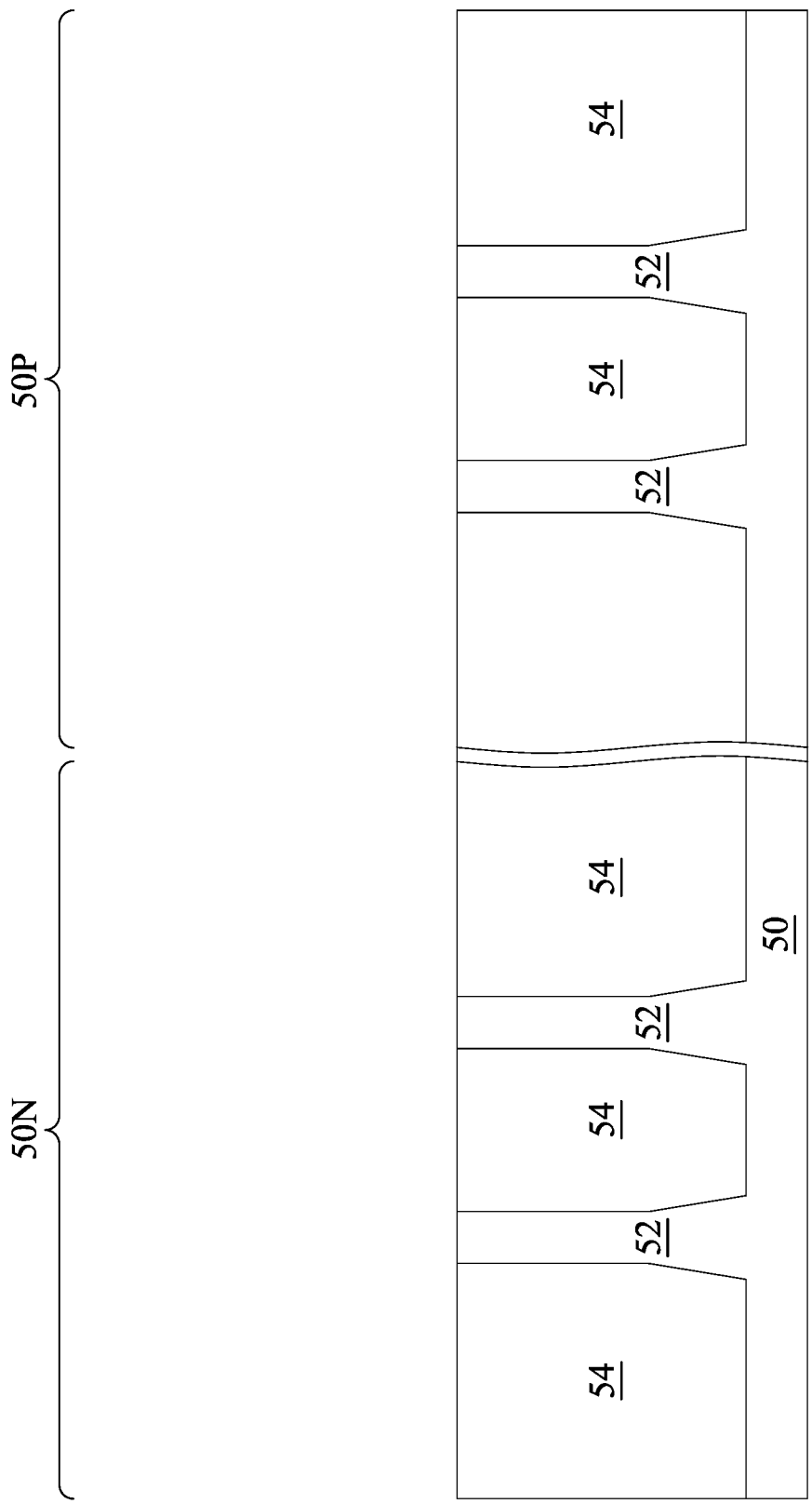

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
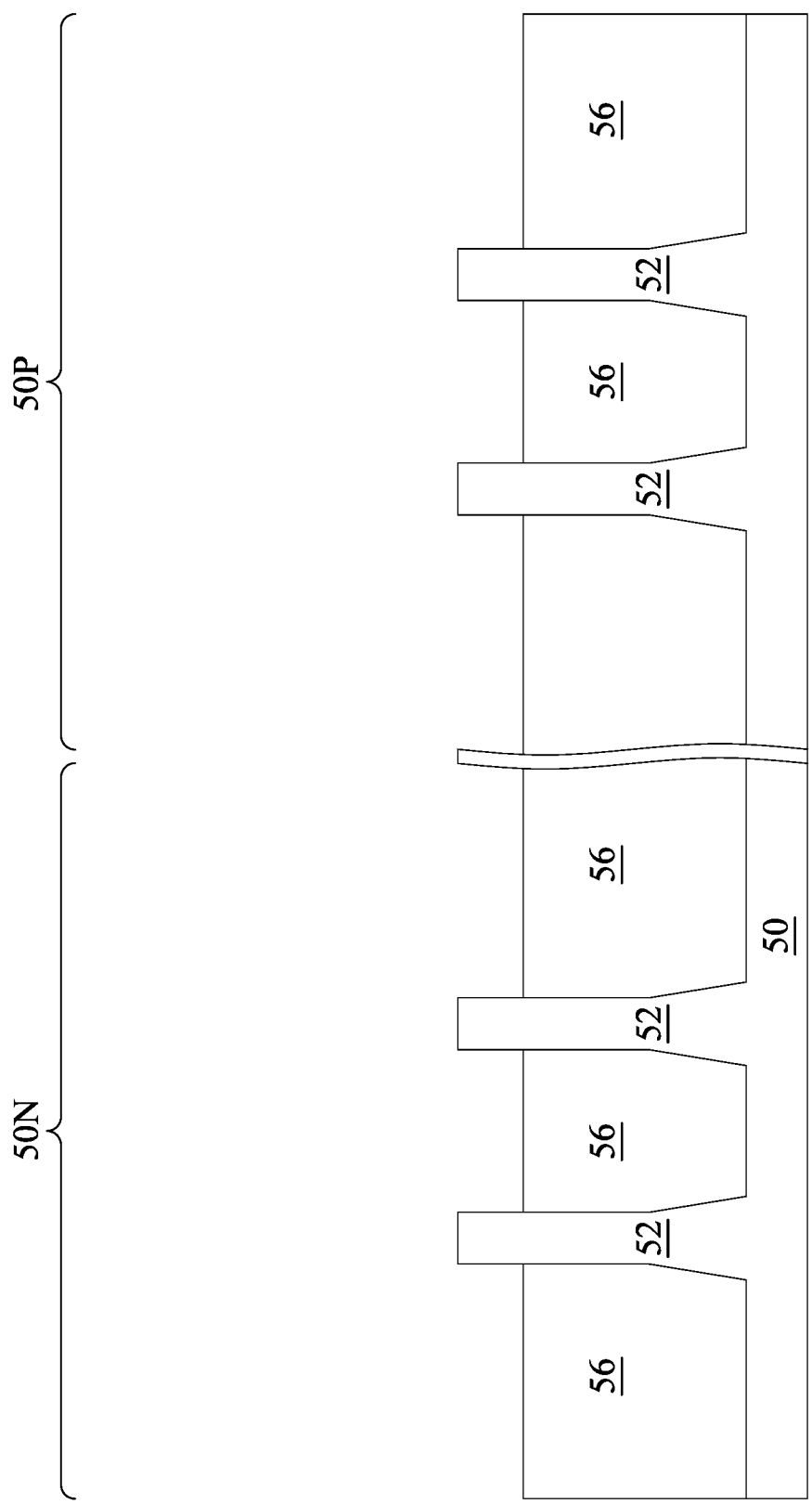

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
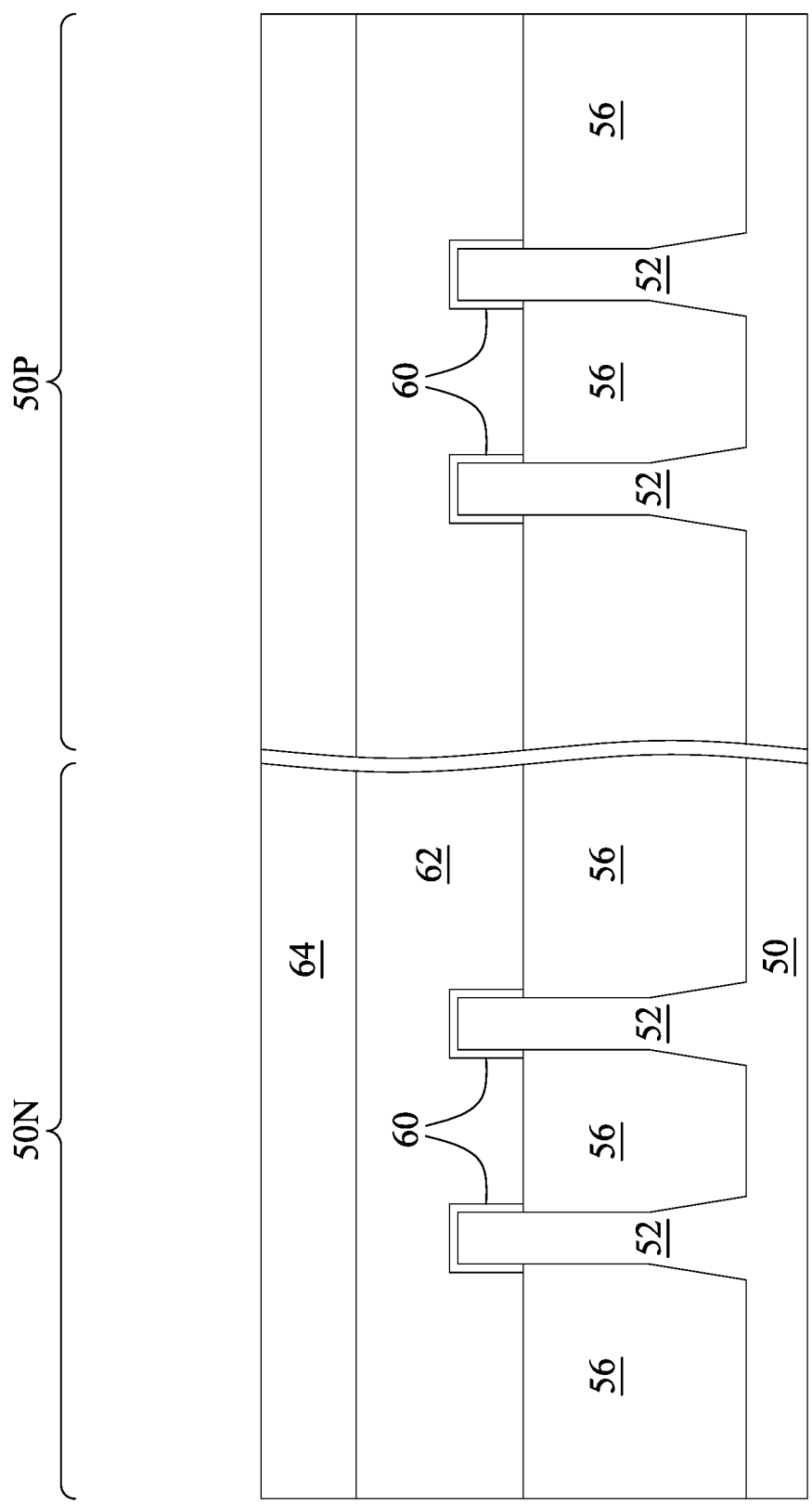

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 17, 19, 21 through 24C, and 27A through 29B illustrate various additional steps in the manufacturing of embodiment devices. FIGS. 8A through 17, 19, 21 through 24C, and 27A through 29B illustrate features in either of the n-type region 50N and the p-type region 50P. For example, the structures illustrated in FIGS. 8A through 17, 19, 21 through 24C, and 27A through 29B may be applicable to both the n-type region 50N and the p-type region 50P. Differences (if any) in the structures of the n-type region 50N and the p-type region 50P are described in the text accompanying each figure.

Figure 8B:
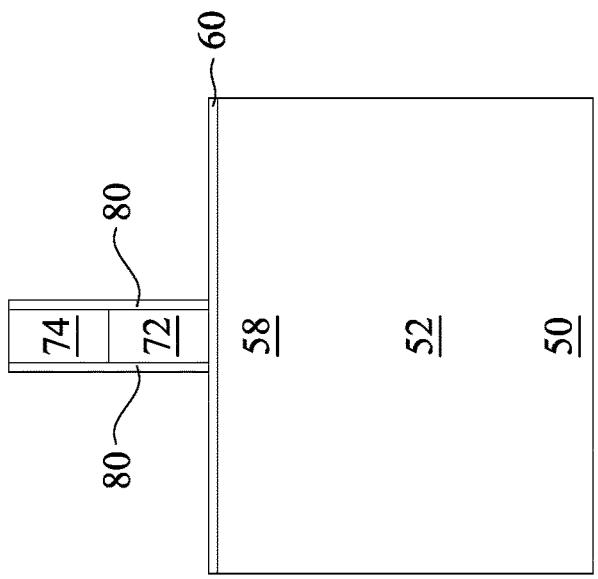
Figure 8A:
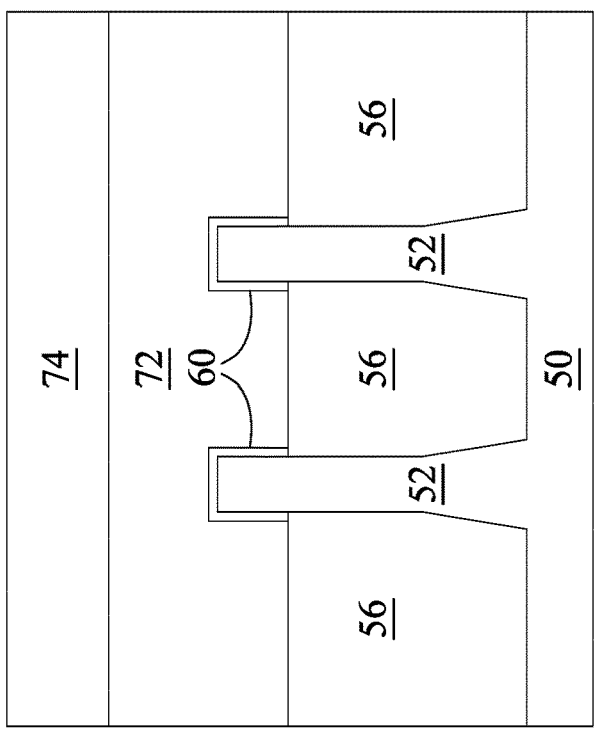

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
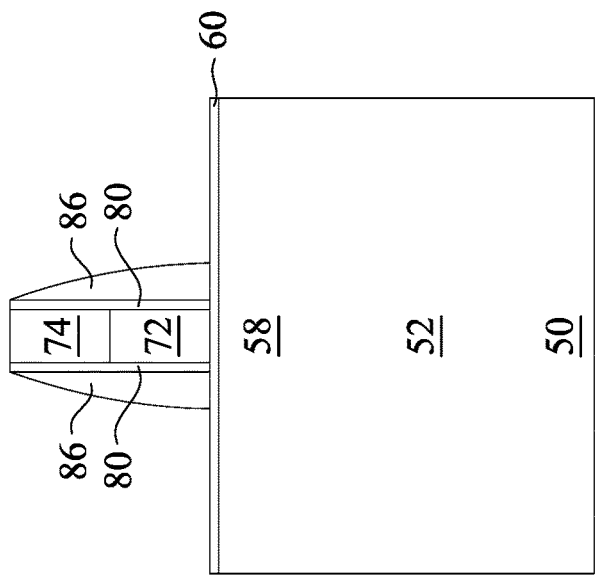
Figure 9A:
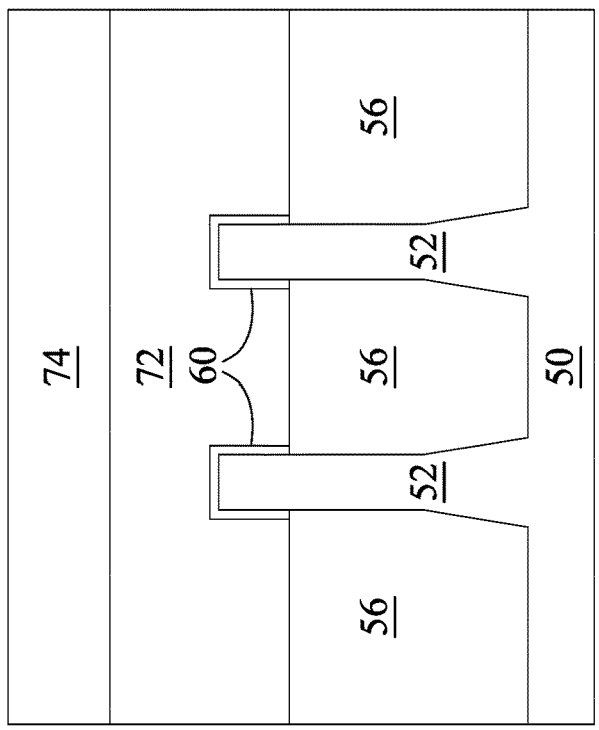

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
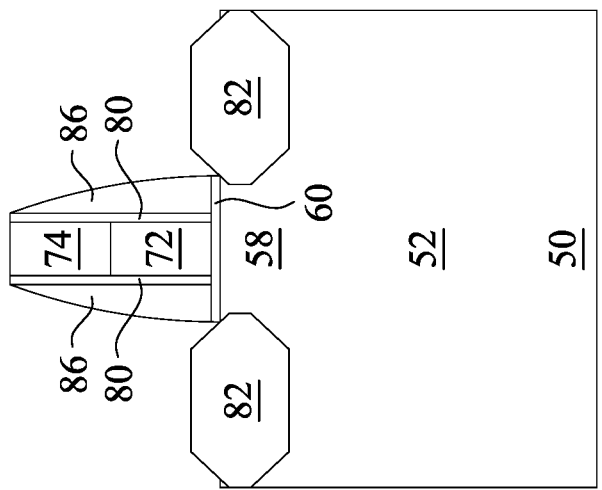
Figure 10A:
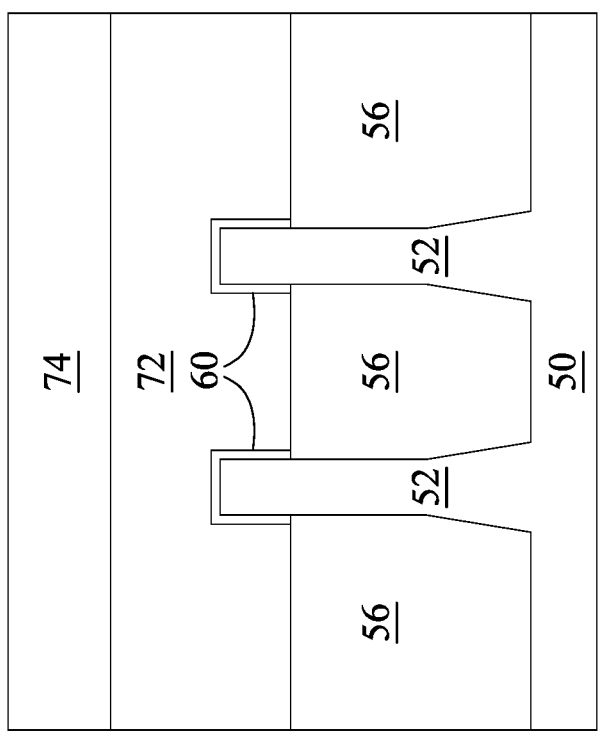
Figure 10D:
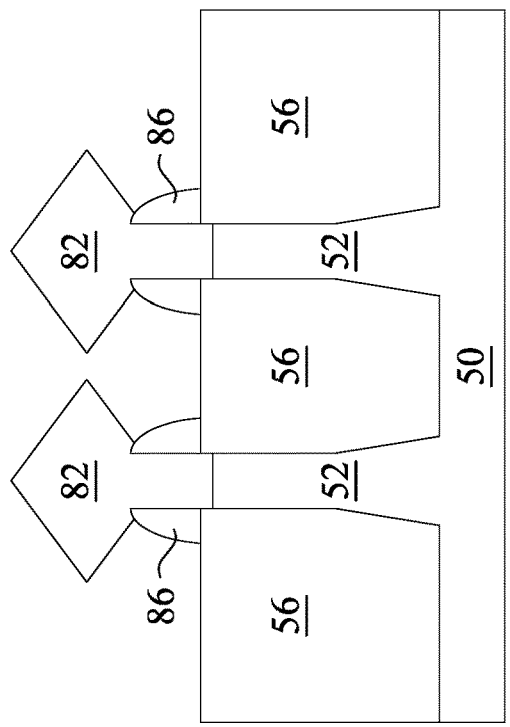
Figure 10C:
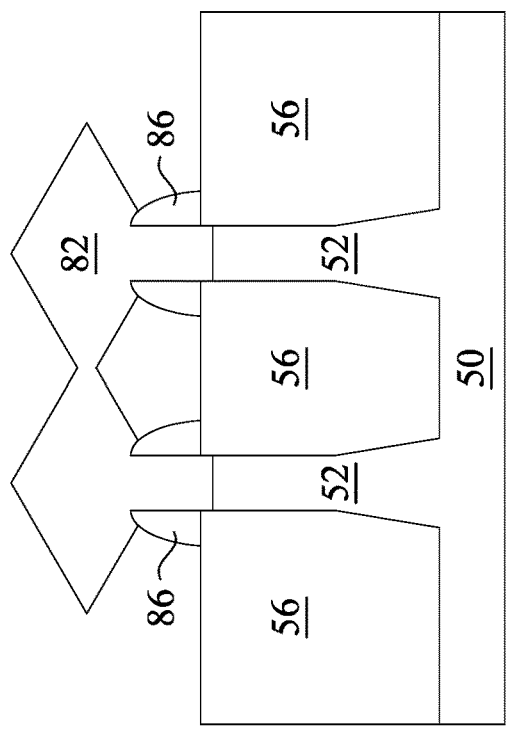

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
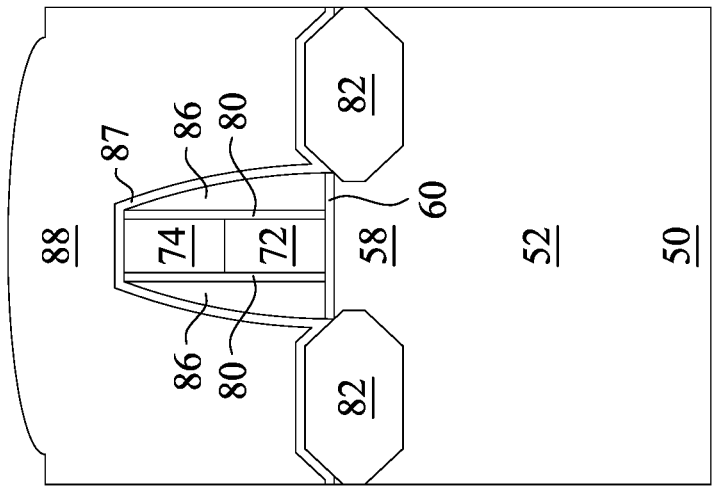
Figure 11A:
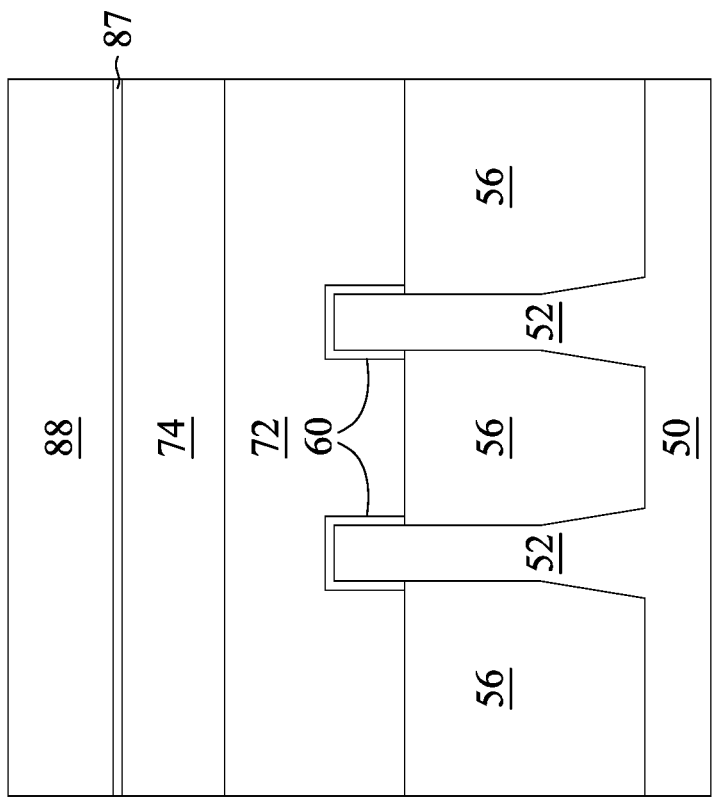

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12B:
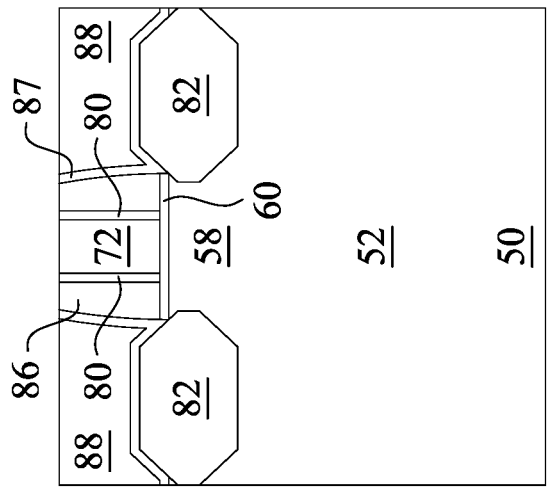
Figure 12A:
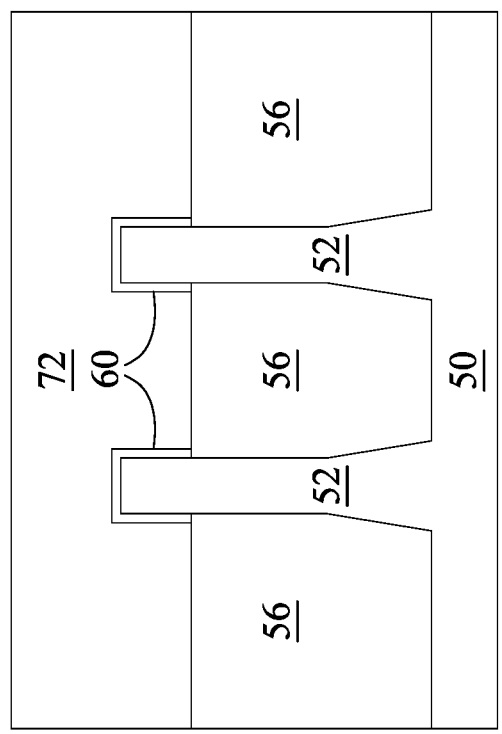

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
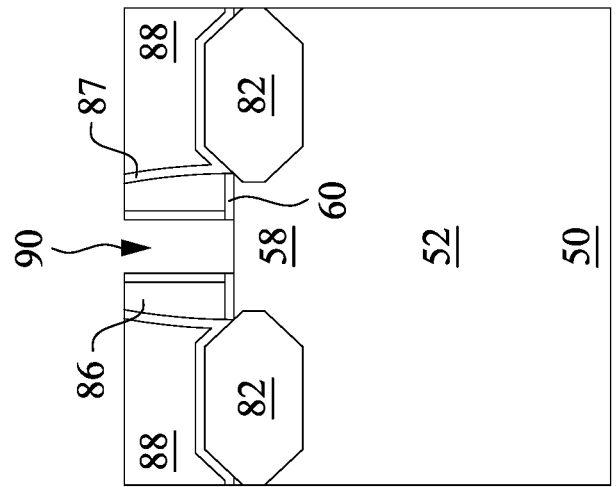
Figure 13A:
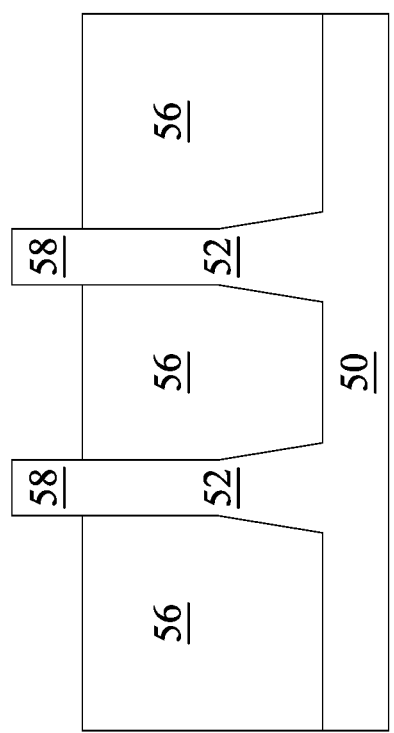

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
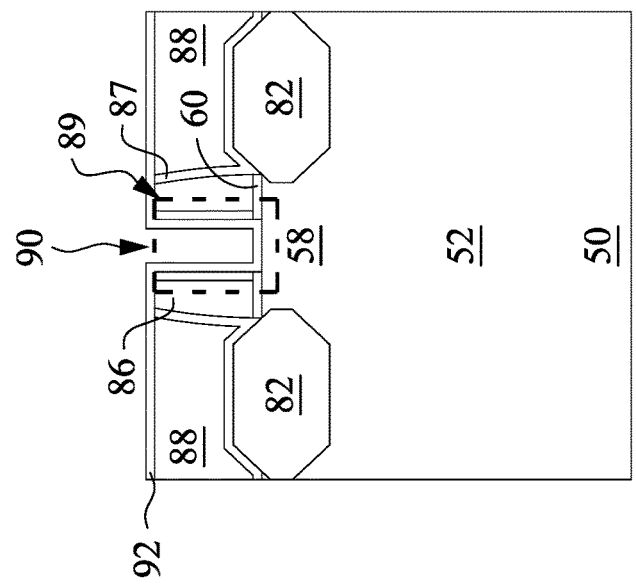
Figure 14A:
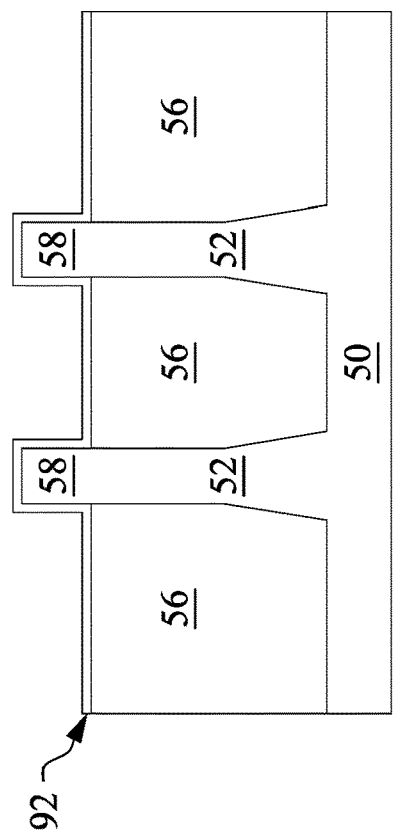
Figure 14C:
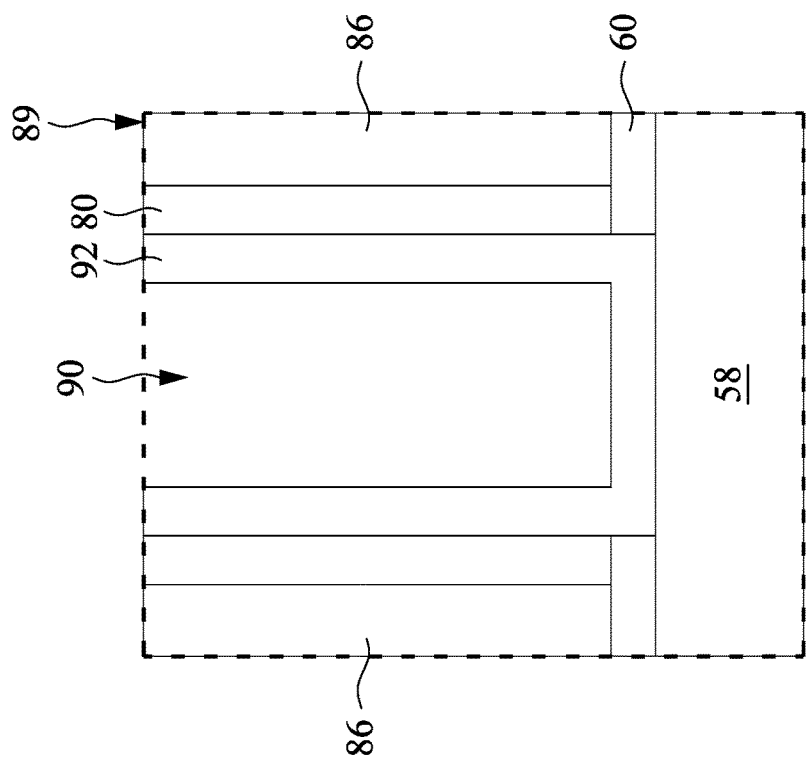

In FIGS. 14A and 14B, gate dielectric layers 92 are formed for replacement gates. FIG. 14C illustrates a detailed view of region 89 of FIG. 14B. Gate dielectric layers 92 are one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The formation of the gate dielectric layers 92 in the n-type region 50N and the p-type region 50P may occur simultaneously such that the gate dielectric layers 92 in each region are formed from the same materials. In some embodiments, the gate dielectric layers 92 in each region may be formed by distinct processes, such that the gate dielectric layers 92 in the n-type region 50N and the p-type region 50P may be different materials. Various masking steps may be used to mask and expose appropriate regions when using distinct processes.

Figure 15:
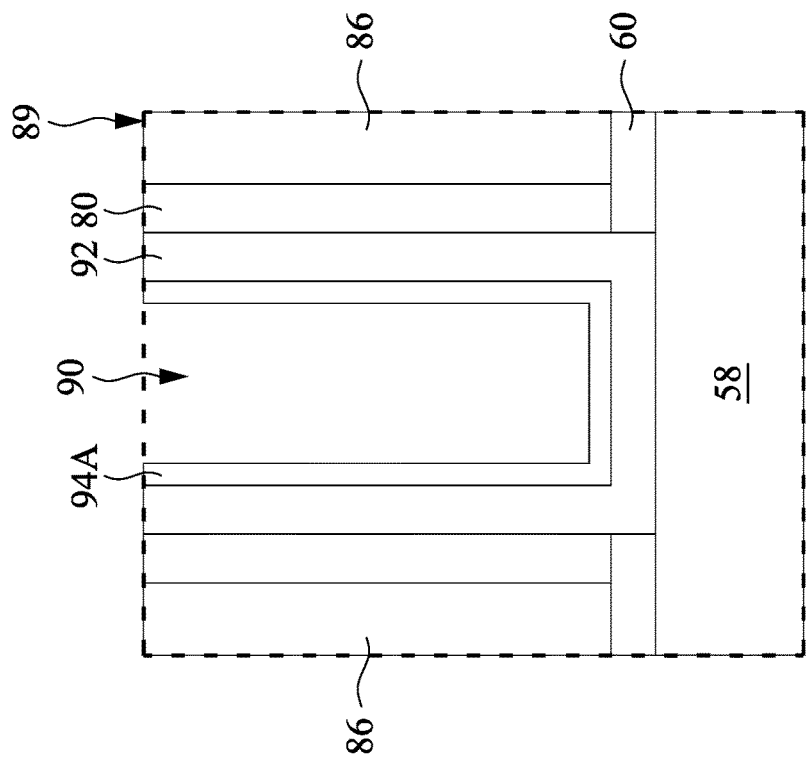

FIGS. 15 through 23C illustrate the formation of gate electrodes 94 (see below, FIG. 23C) over the gate dielectric layers 92, respectively, filling the remaining portions of the recesses 90. FIG. 15 illustrates the formation of a liner layer 94A over the gate dielectric layer 92 in a detailed view of region 89 of FIG. 14B. The liner layer 94A may be a diffusion barrier layer, an adhesion layer, the like, or a combination thereof. The liner layer 94A may include a metal-containing material such as titanium nitride, titanium oxide, tantalum nitride, tantalum carbide, combinations thereof, or multi-layers thereof. Although a single liner layer 94A is illustrated in FIG. 15, the gate electrode 94 may comprise any number of liner layers 94A.

Figure 16:
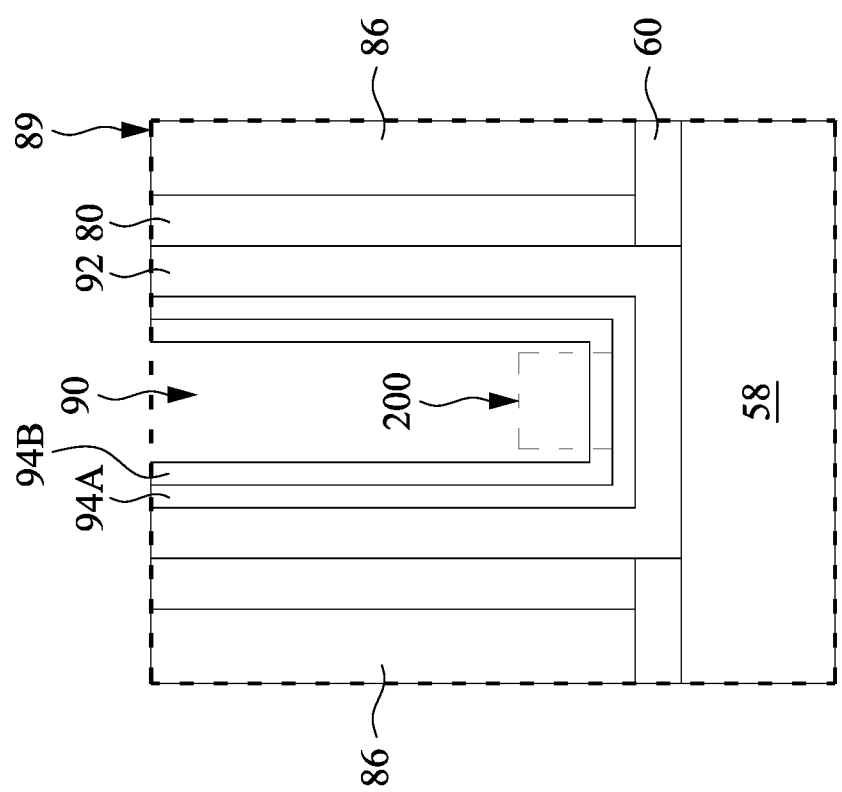

FIG. 16 illustrates the formation of a work function tuning layer 94B over the liner layer 94A. The work function tuning layer 94B may be used to adjust the work function of the gate electrode 94 (see below, FIG. 23C) to the band-edge of silicon or other underlying semiconductor material. For example, for an NMOS device, the work function may be adjusted to close to the conduction band of silicon, and for a PMOS device, the work function may be adjusted to close to the valence band of silicon, to increase the performance of the transistors. The work function tuning layer 94B may include a metal-containing material such as titanium, titanium nitride, titanium aluminum nitride, tantalum nitride, tantalum aluminum, tantalum aluminum carbide, tantalum aluminum nitride, tantalum carbide, tantalum carbonitride, tantalum silicon nitride. ruthenium, molybdenum, aluminum, tungsten nitride, silver, manganese, zirconium, combinations thereof, or multi-layers thereof. Although a single work function tuning layer 94B is illustrated in FIG. 16, the gate electrode 94 may comprise any number of work function tuning layers 94B. In some embodiments, the work function tuning layer 94B is formed over the gate dielectric layers 92, and the liner layer 94A is formed over the work function tuning layer 94B.

FIGS. 17, 19, and 21-22B illustrate a detailed view of region 200 of FIG. 16 showing the formation of a fill material 94C (see below, FIGS. 22A and 23C), in accordance with some embodiments. The fill material 94C is formed of a conductive material, e.g. tungsten, cobalt, ruthenium, aluminum, the like, or a combination thereof, using an atomic layer deposition (ALD) process performed on the FinFET in a deposition chamber (not shown). The ALD process includes alternating cycles of a first ALD cycle 1000 with a process gas comprising boron (see below, FIG. 18) and a second ALD cycle 2000 with a process gas comprising silicon (see below, FIG. 20). By including the first ALD cycle 1000 and the second ALD cycle 2000 in the ALD process, the fill material 94C may achieve lower resistance and better gap-filling of the recesses 90, providing improved device performance.

Prior to the first ALD cycle 1000 and/or the second ALD cycle 2000, a gaseous pre-soak may be performed on the work function tuning layer 94B. The gaseous pre-soak may prepare the exposed surfaces of the work function tuning layer 94B for nucleation during the first ALD cycle. The gaseous pre-soak may be performed with a process gas comprising silicon, e.g. silane, or with a process gas comprising boron, e.g. diborane. In some embodiments, the gaseous pre-soak is performed with a gas flow of the process gas in a range of 200 sccm to 600 sccm. In some embodiments, the gaseous pre-soak is performed for a duration in a range of 5 seconds to 50 seconds.

Figure 17:
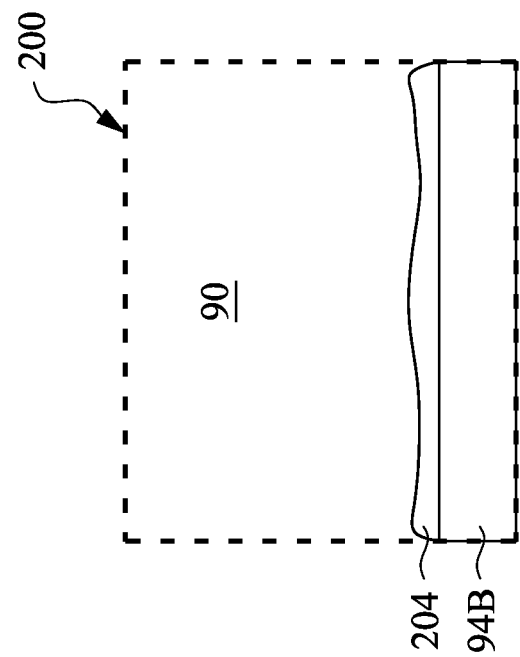
Figure 18:
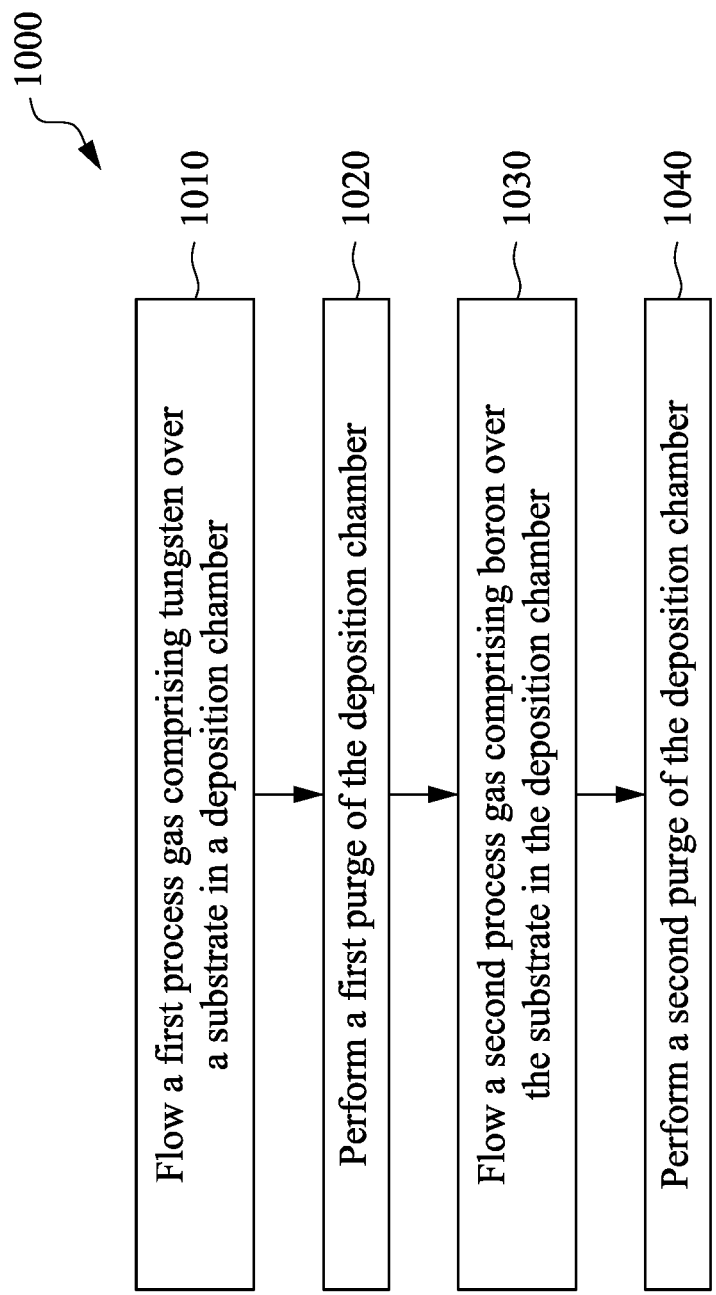
FIG. 18 illustrates a flow chart of a method of a deposition process, in accordance with some embodiments.

FIG. 17 illustrates a formation of a first layer 204 of the fill material 94C (see below, FIGS. 22A and 23C) on a substrate, such as on the work function tuning layer 94B, or on the liner layer 94A if the work function tuning layer 94B is not present or underlies the liner layer 94A (see above, FIG. 16). FIG. 18 is a flow chart illustrating the first ALD cycle 1000, in accordance with some embodiments. After the pre-soak, the first ALD cycle 1000 is performed to deposit the first layer 204 on the work function tuning layer 94B. The first layer 204 comprises a conductive material, e.g. tungsten, and is formed with one or more first ALD cycles 1000.

The first step 1010 of the first ALD cycle 1000 is performed by flowing the first process gas comprising a conductive material, e.g. tungsten, into the deposition chamber so that molecules of the first process gas attach to reactive sites on the substrate, e.g. the work function tuning layer 94B, which may form a monolayer of molecules of the first process gas on the substrate. In some embodiments, the first process gas comprises tungsten hexafluoride ($WF_6$), tungsten pentachloride ($WCl_5$), tungsten hexachloride ($WCl_6$), the like, or a combination thereof.

In some embodiments, the first process gas is flowed into the deposition chamber with a flow rate in a range of 30 standard cubic centimeter per minute (sccm) to 90 sccm. In some embodiments, the first step 1010 is performed for a duration in a range of 1 seconds to 5 seconds. In some embodiments, the first step 1010 is performed with a pressure in the deposition chamber in a range of 3 torr to 10 torr. In some embodiments, the first step 1010 is performed at a temperature in a range of 250° C. to 350° C. However, the first step 1010 may be performed with any suitable process conditions.

The second step 1020 of the first ALD cycle 1000 is performed by purging the deposition chamber with a purge gas such as $N_2$, Ar, the like, or a combination thereof. The purging removes the process gas used in a previous step, such as the first process gas used in the first step 1010, from the deposition chamber.

The third step 1030 of the first ALD cycle 1000 is performed by flowing the second process gas comprising boron, such as diborane ($B_2H_6$) or the like, into the deposition chamber so that the second process gas reacts with the monolayer of molecules of the first process gas formed on the substrate, e.g. the work function tuning layer 94B, in the first step 1010. In some embodiments in which the first process gas is tungsten hexafluoride ($WF_6$) and the second process gas is diborane ($B_2H_6$), the reaction may be described by Eq. 1 below:

$$2WF_6 + B_2H_6 \rightarrow 6HF + 2W + 2BF_3 \qquad \text{Eq. (1)}$$

In Eq. 1 above, the monolayer of tungsten hexafluoride on the work function tuning layer 94B reacts with the diborane to produce tungsten, which may remain as a monolayer on the work function tuning layer 94B and form a portion of the first layer 204 (see FIG. 17). Hydrogen fluoride (HF) and boron trifluoride ($BF_3$) gas may also be produced, which may be subsequently purged.

In some embodiments, the second process gas is flowed into the deposition chamber with a flow rate in a range of 25 sccm to 600 sccm. In some embodiments, the third step 1030 is performed with a pressure in the deposition chamber in a range of 3 torr to 10 torr. In some embodiments, the third step 1030 is performed at a temperature in a range of 250° C. to 350° C. In some embodiments, the third step 1030 is performed for a duration in a range of 1 seconds to 5 seconds. However, the third step 1030 may be performed with any suitable process conditions.

The fourth step 1040 of the first ALD cycle 1000 is performed by purging the deposition chamber with a purge gas such as described above with respect to the second step 1020. The purging removes the process gas used in a previous step, such as the second process gas used in the third step 1030, from the deposition chamber, as well as other reaction byproducts such as hydrogen fluoride (HF) and boron trifluoride ($BF_3$).

It should be appreciated that the specific ranges of parameters recited above for the process conditions of the first ALD cycle 1000 are a non-limiting example intended for illustrative purposes. Any suitable process conditions may be used for the first ALD cycle 1000, even if the conditions are outside of the ranges that are explicitly recited above. All such conditions are fully intended to be included within the scope of the embodiments.

In some embodiments, the first ALD cycle 1000 forms a single monolayer of a conductive material, e.g. tungsten, as the first layer 204. In some embodiments, the first ALD cycle 1000 is repeated, such as for 3 cycles to 10 cycles, to form more than one monolayer of the conductive material. The first ALD cycle 1000 may be repeated until the first layer 204 reaches a desired thickness such as a thickness in a range of 2 nm to 10 nm. The reactions of molecules of the second process gas comprising boron, e.g. diborane, with molecules of the first process gas comprising a conductive material, e.g. tungsten hexafluoride, may have higher Gibbs free energy than reactions of the first process gas with a process gas comprising silicon, e.g. silane. This may lead to the first layer 204 being formed with a base nucleation layer having an amorphous phase structure and a smoother surface, which may provide better gap-filling capability.

Although the first ALD cycle 1000 is described above as being performed in the sequence of the first step 1010, the second step 1020, the third step 1030, and the fourth step 1040, in some embodiments the steps of the first ALD cycle 1000 are performed in other sequences. As a first example, the first ALD cycle 1000 is performed in the sequence of the third step 1030, the fourth step 1040, the first step 1010, and the second step 1020. In this first example, the second process gas comprising boron is flowed into the deposition chamber prior to flowing the first process gas comprising tungsten and the deposition chamber is purged after each step of flowing the second process gas and the first process gas into the deposition chamber, respectively. As a second example, the first ALD cycle 1000 is performed in the sequence of the second step 1020, the first step 1010, the fourth step 1040, and the third step 1030. In this second example, the deposition chamber is purged prior to each step of flowing the first process gas and the second process gas into the deposition chamber, respectively, and the first process gas comprising tungsten is flowed into the deposition chamber prior to flowing the second process gas comprising boron into the deposition chamber. As a third example, the first ALD cycle 1000 is performed in the sequence of the fourth step 1040, the third step 1030, the second step 1020, and the first step 1010. In this third example, the deposition chamber is purged prior to each step of flowing the second process gas and the first process gas into the deposition chamber, respectively, and the second process gas comprising boron is flowed into the deposition chamber prior to flowing the first process gas comprising tungsten into the deposition chamber.

Figure 19:
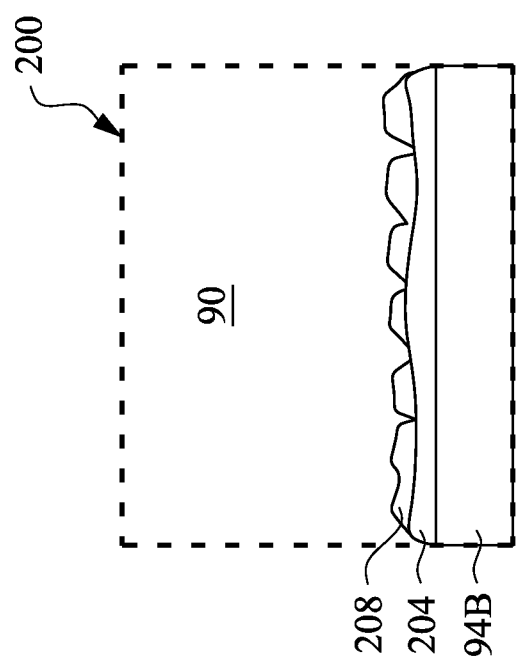
Figure 20:
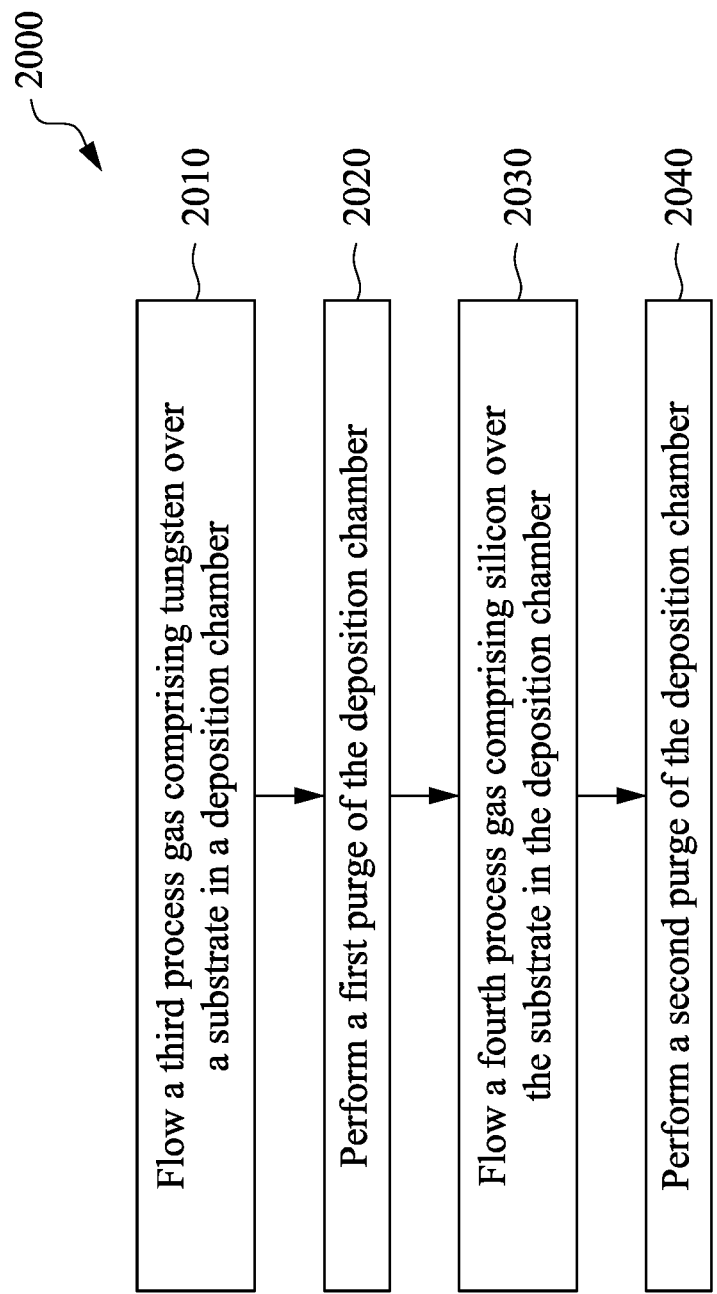
FIG. 20 illustrates a flow chart of a method of a deposition process, in accordance with some embodiments.

FIG. 19 illustrates a formation of a second layer 208 of the fill material 94C (see below, FIGS. 22A and 23C) on the first layer 204. The second layer 208 comprises a conductive material, e.g. tungsten, and is formed with one or more second ALD cycles 2000. FIG. 20 is a flow chart illustrating the second ALD cycle 2000, in accordance with some embodiments.

The first step 2010 of the second ALD cycle 2000 is performed by flowing a third process gas comprising a conductive material, e.g. tungsten, into the deposition chamber so that molecules of the third process gas attach to reactive sites on the substrate, e.g. the first layer 204, which may form a monolayer of molecules of the third process gas on the substrate. In some embodiments, the third process gas is the same as the first process gas described above with respect to the first step 1010 of the first ALD cycle 1000 (see above, FIG. 18), such as tungsten hexafluoride ($WF_6$).

In some embodiments, the third process gas is flowed into the deposition chamber with a flow rate in a range of 25 standard cubic centimeter per minute (sccm) to 600 sccm. In some embodiments, the first step 2010 is performed with a pressure in the deposition chamber in a range of 3 torr to 10 torr. In some embodiments, the first step 2010 is performed at a temperature in a range of 250° C. to 350° C. In some embodiments, the first step 2010 is performed for a duration in a range of 1 seconds to 5 seconds. However, the first step 2010 may be performed with any suitable process conditions.

The second step 2020 of the second ALD cycle 2000 is performed by purging the deposition chamber with a purge gas such as described above with respect to the second step 1020 of the first ALD cycle 1000 (see above, FIG. 18). The purging removes the process gas used in a previous step, such as the third process gas used in the first step 2010, from the deposition chamber.

The third step 2030 of the second ALD cycle 2000 is performed by flowing the fourth process gas comprising silicon, such as silane ($SiH_4$), disilane ($Si_2H_6$), trisilane ($Si_3H_8$), the like, or a combination thereof, into the deposition chamber so that the fourth process gas reacts with the monolayer of molecules of the third process gas formed on the substrate, e.g. the first layer 204, in the first step 2010. In some embodiments in which the third process gas is tungsten hexafluoride ($WF_6$) and the fourth process gas is silane ($SiH_4$), the reaction may be described by Eq. 2 below:

$$2WF_6 + 3SiH_4 \rightarrow 2W + 6H_2 + 3SiF_4 \qquad \text{Eq. (2)}$$

In Eq. 2 above, the monolayer of tungsten hexafluoride on the first layer 204 reacts with the silane to produce tungsten, which may remain as a monolayer on the first layer 204 and form a portion of the second layer 208 (see FIG. 19). Hydrogen gas ($H_2$) and silicon tetrafluoride ($SiF_4$) gas may also be produced, which may be subsequently purged.

In some embodiments, the fourth process gas is flowed into the deposition chamber with a flow rate in a range of 25 sccm to 600 sccm. In some embodiments, the third step 2030 is performed with a pressure in the deposition chamber in a range of 3 torr to 10 torr. In some embodiments, the third step 2030 is performed at a temperature in a range of 250° C. to 350° C. In some embodiments, the third step 2030 is performed for a duration in a range of 1 seconds to 5 seconds. However, the third step 2030 may be performed with any suitable process conditions.

The fourth step 2040 of the second ALD cycle 2000 is performed by purging the deposition chamber with a purge gas such as described above with respect to the second step 1020 of the first ALD cycle 1000 (see above, FIG. 18). The purging removes the process gas used in a previous step, such as the fourth process gas used in the third step 2030, from the deposition chamber, as well as other reaction byproducts such as hydrogen gas ($H_2$) and silicon tetrafluoride ($SiF_4$) gas.

It should be appreciated that the specific ranges of parameters recited above for the process conditions of the second ALD cycle 2000 are a non-limiting example intended for illustrative purposes. Any suitable process conditions may be used for the second ALD cycle 2000, even if the conditions are outside of the ranges that are explicitly recited above. All such suitable conditions are fully intended to be included within the scope of the embodiments.

In some embodiments, the second ALD cycle 2000 forms a single monolayer of a conductive material, e.g. tungsten, as the second layer 208. In some embodiments, the second ALD cycle 2000 is repeated, such as for 2 cycles to 10 cycles, to form more than one monolayer of the conductive material. The second ALD cycle 2000 may be repeated until the second layer 208 reaches a desired thickness, such as a thickness in a range of 2 nm to 10 nm. The reactions of molecules of the fourth process gas comprising silicon, e.g. silane, with molecules of the third process gas comprising a conductive material, e.g. tungsten hexafluoride, may have lower Gibbs free energy than reactions of the third process gas with a process gas comprising boron, e.g. diborane. This may lead to the second layer 208 being formed with a base nucleation layer having a crystalline phase structure and larger metal grain sizes, which may provide lower resistance and better device performance.

Although the second ALD cycle 2000 is described above as being performed in the sequence of the first step 2010, the second step 2020, the third step 2030, and the fourth step 2040, in some embodiments the steps of the second ALD cycle 2000 are performed in other sequences. As a first example, the second ALD cycle 2000 is performed in the sequence of the third step 2030, the fourth step 2040, the first step 2010, and the second step 2020. In this first example, the fourth process gas comprising silicon is flowed into the deposition chamber prior to flowing the third process gas comprising tungsten and the deposition chamber is purged after each step of flowing the fourth process gas and the third process gas into the deposition chamber, respectively. As a second example, the second ALD cycle 2000 is performed in the sequence of the second step 2020, the first step 2010, the fourth step 2040, and the third step 2030. In this second example, the deposition chamber is purged prior to each step of flowing the third process gas and the fourth process gas into the deposition chamber, respectively, and the third process gas comprising tungsten is flowed into the deposition chamber prior to flowing the fourth process gas comprising silicon into the deposition chamber. As a third example, the second ALD cycle 2000 is performed in the sequence of the fourth step 2040, the third step 2030, the second step 2020, and the first step 2010. In this third example, the deposition chamber is purged prior to each step of flowing the third process gas and the fourth process gas into the deposition chamber, respectively, and the fourth process gas comprising silicon is flowed into the deposition chamber prior to flowing the third process gas comprising tungsten into the deposition chamber.

FIG. 21 illustrates the formation of a third layer 212 of the fill material 94C (see below, FIGS. 22A and 23C) on the second layer 208. The third layer 212 comprises tungsten and is formed with one or more additional first ALD cycles 1000, as described above with respect to FIG. 18. By forming the smoother third layer 212 on the second layer 208, which may have larger metal grain sizes, the fill material 94C may have a smoother surface and improved gap-filling capability while maintaining lower resistance due to the larger tungsten metal grain sizes of the second layer 208.

FIG. 22 illustrates the formation of a fourth layer 216 of the fill material 94C on the third layer 212. The fourth layer 216 comprises tungsten and is formed with one or more additional second ALD cycles 2000, as described above with respect to FIG. 20. By forming the fourth layer 216 with larger tungsten metal grain sizes on the smoother third layer 212, the fill material 94C may have a lower resistance and improved device performance while maintaining improved gap-filling capability due to the smoother surface of the third layer 212.

Although the above gap-filling process to fill the recesses 90 is described in the context of forming a fill material for a gate electrode, it is understood that one of ordinary skill in the art will appreciate that the above examples are provided for illustrative purposes only to further explain applications of the present embodiments. In some embodiments, the one or more embodiment processes described above with respect to FIGS. 17-22 are used to fill any suitable gap, opening, or recess with a conductive material such as tungsten in alternating layers such as first layers 204, second layers 208, third layers 212, and fourth layers 216 in any suitable order to provide lower resistance and improved gap-filling capability.

FIG. 23 illustrates another embodiment of the fill material 94C in which the layers of the fill material 94C are formed in a different order from the embodiment illustrated above in FIG. 22. As illustrated in FIG. 23, the second layer 208 is formed on a substrate, such as the work function tuning layer 94B, the first layer 204 is formed on the second layer 208, the fourth layer 216 is formed on the first layer 204, and the third layer 212 is formed on the fourth layer 216. The embodiment of FIG. 23 may be formed using similar methods and materials as described above for the embodiment of FIG. 22 with respect to FIGS. 17-21, with a difference in sequence that one or more second ALD cycles 2000 are performed first to deposit the second layer 208 on the work function tuning layer 94B, followed by one or more first ALD cycles 1000 to deposit the first layer 204 on the second layer 208, one or more additional second ALD cycles 2000 to deposit the fourth layer 216 on the first layer 204, and one or more additional first ALD cycles 1000 to deposit the third layer 212 on the fourth layer 216.

Any suitable numbers of first ALD cycles 1000 and second ALD cycles 2000 in any suitable order and any suitable sequences of steps for each first ALD cycle 1000 and second ALD cycle 2000 are within the scope of the disclosed embodiments. As a first example, the first ALD cycle 1000 is performed for X cycles, where X can be any suitable number of cycles (e.g., 1 to 10 cycles), the second ALD cycle 2000 is performed for X cycles, and the ALD process is repeated until a suitable thickness of the fill material 94C is formed. As a second example, the second ALD cycle 2000 is performed for X cycles, the first ALD cycle 1000 is performed for X cycles, and the ALD process is repeated until a suitable thickness of the fill material 94C is formed. As a third example, the first ALD cycle 1000 is performed for X cycles, the second ALD cycle 2000 is performed for X cycles, the first ALD cycle 1000 is performed for X cycles, and the ALD process is repeated until a suitable thickness of the fill material 94C is formed. As a fourth example, the second ALD cycle 2000 is performed for X cycles, the first ALD cycle 1000 is performed for X cycles, the second ALD cycle 2000 is performed for X cycles, and the ALD process is repeated until a suitable thickness of the fill material 94C is formed.

Figure 24B:
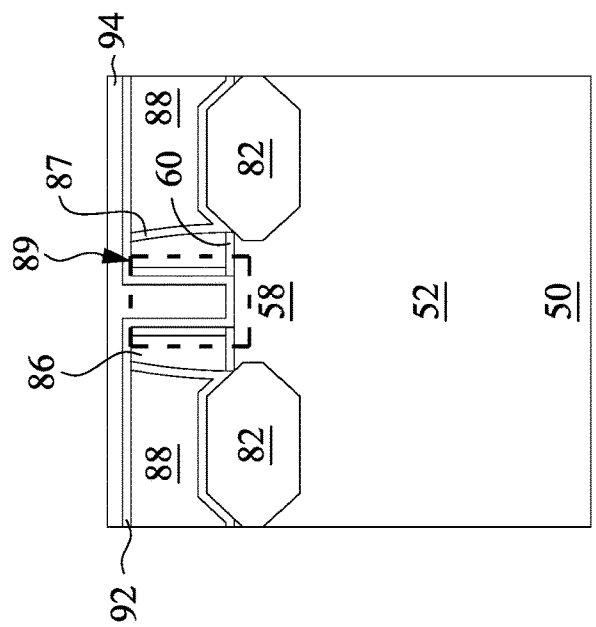
Figure 24A:
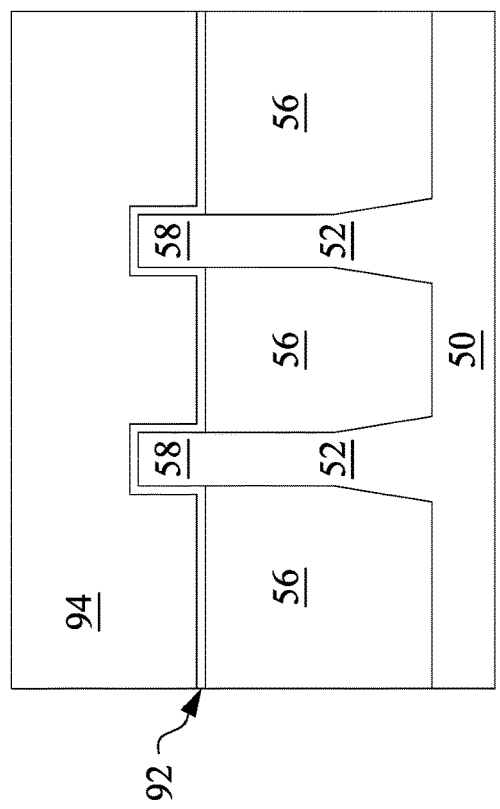
Figure 24C:
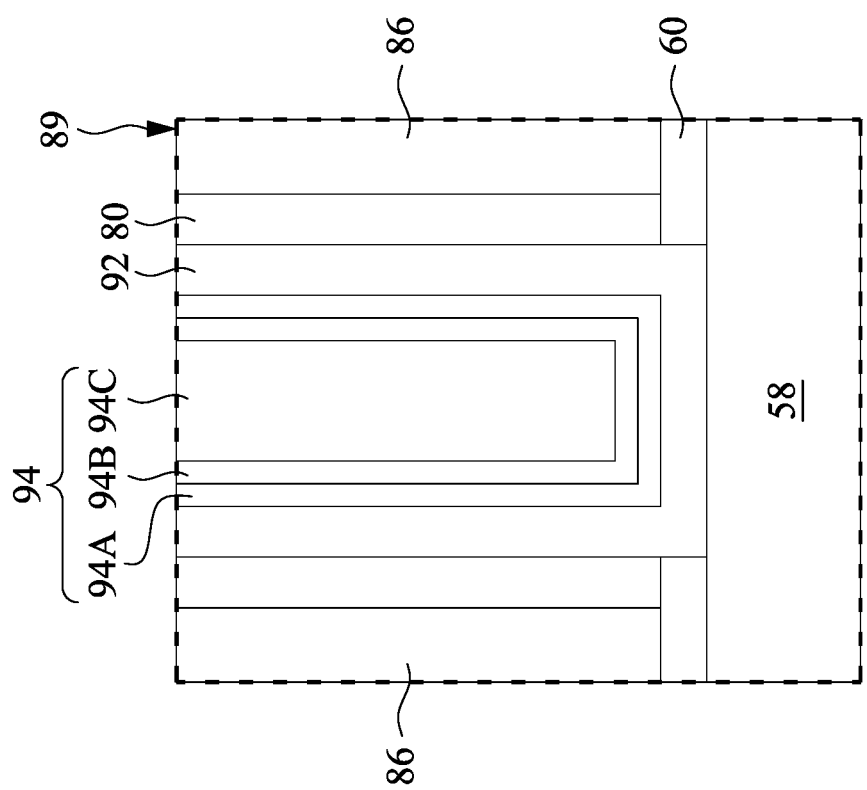

In FIGS. 24A and 24B, remaining volumes of the recesses 90 are filled by the fill material 94C. FIG. 24C illustrates a detailed view of region 89 of FIG. 24B. The recesses 90 are filled by the fill material 94C by one or more embodiment processes described above with respect to FIGS. 17-23, e.g. repetition of alternating numbers of first ALD cycles 1000 and second ALD cycles 2000 to form tungsten layers such as first layers 204, second layers 208, third layers 212, and fourth layers 216 in any suitable order.

Figure 25B:
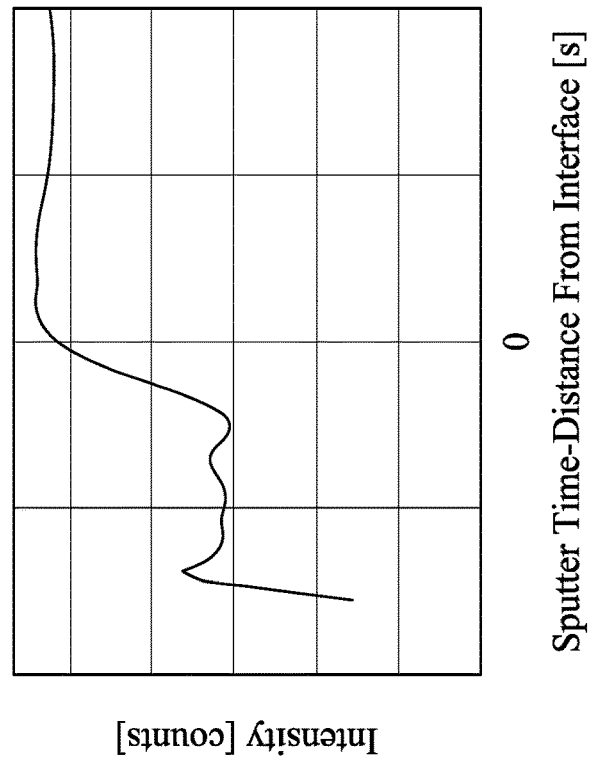
FIGS. 25A and 25B illustrate dynamic secondary ion mass spectrometry graphs, in accordance with some embodiments.
Figure 25A:
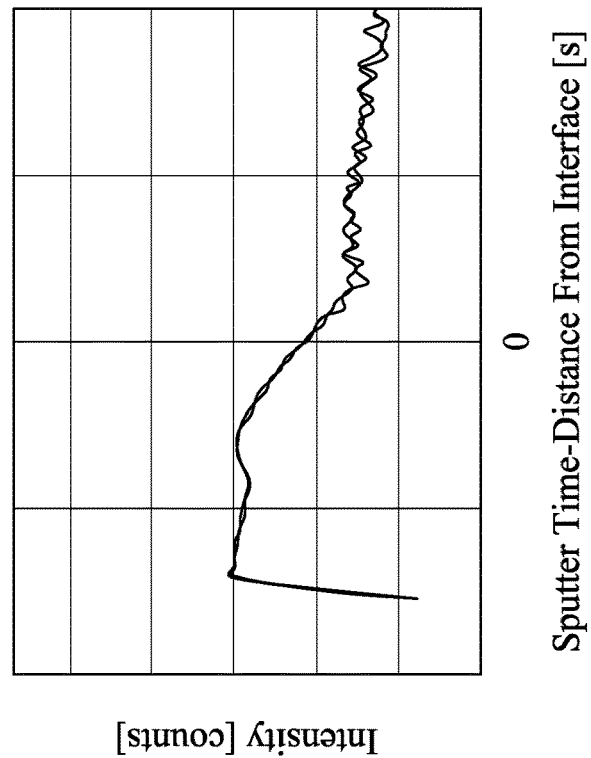

FIGS. 25A and 25B illustrate dynamic secondary ion mass spectrometry (SIMS) graphs showing the presence of boron atoms and silicon atoms, respectively, in the gate electrode 94, gate dielectric layer 92, and channel region 58 of the fin 52 (see above, FIG. 24B). The x-axes of FIGS. 25A and 25B show depth in the gate electrode 94, gate dielectric layer 92, and channel region 58, with 0 corresponding to the interface between the gate dielectric layer 92 and the channel region 58, and the y-axes of FIGS. 25A and 25B show intensities of counts of boron and silicon, respectively, in the same log scale as measured by dynamic SIMS.

FIG. 25A illustrates the presence of boron atoms in the gate electrode 94 due to boron remaining from the use of a process gas comprising boron, e.g. diborane, during the formation of the fill material 94C (see above, FIGS. 17-23). FIG. 25A further illustrates the density of boron decreasing by a factor in a range of 10 to 100 from the gate electrode 94 to the fin 52. The use of the process gas comprising boron may provide a smoother surface and better gap-filling capability for the gate electrode 94. FIG. 25B illustrates the presence of silicon atoms in the gate electrode 94 due to silicon remaining from the use of a process gas comprising silicon, e.g. silane, during the formation of the fill material 94C (see above, FIGS. 17-23). FIG. 25B further illustrates the density of silicon increasing by a factor in a range of 100 to 1000 from the gate electrode 94 to the fin 52, as the fin 52 may be formed from a substrate 50 comprising silicon (see above, FIG. 3). The use of the process gas comprising silicon may provide lower resistance and better device performance for the gate electrode 94. As such, FIGS. 25A and 25B illustrate that the gate electrode 94 has a greater density of boron atoms than a density of silicon atoms.

In some embodiments, the gate electrode 94 has a density as measured by SIMS analysis of boron atoms in a range of $10^2$ intensity counts to $10^4$ intensity counts and a density of silicon atoms in a range of $10^3$ intensity counts to $10^4$ intensity counts, which may be advantageous by being a result of using a process gas comprising boron and a process gas comprising silicon, leading to lower resistance and better gap-filling. In some embodiments, the density of boron atoms in the gate electrode 94 is greater than the density of silicon atoms in the gate electrode 94. The gate electrode 94 having a density of boron atoms less than $10^1$ intensity counts may be disadvantageous by leading to gap-filling defects induced by large tungsten metal grains, and the gate electrode 94 having a density of boron atoms greater than $10^4$ intensity counts may be disadvantageous by leading to higher resistance. The gate electrode 94 having a density of silicon atoms less than $10^3$ intensity counts may be disadvantageous by leading to higher resistance, and the gate electrode 94 having a density of silicon atoms greater than $10^4$ intensity counts may be disadvantageous by leading to gap-filling defects induced by large tungsten metal grains.

Figure 26:
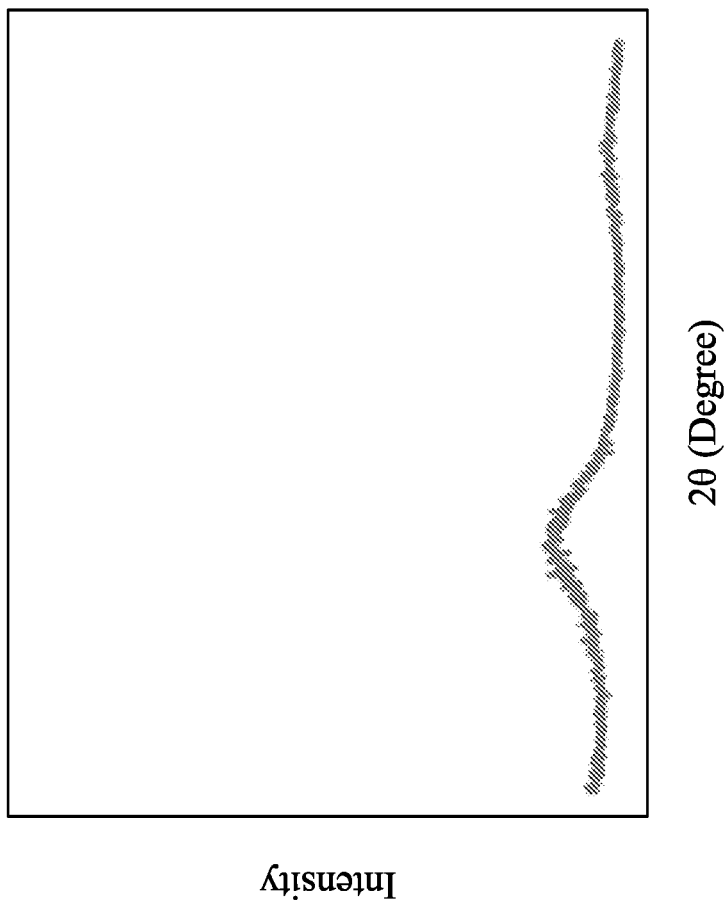
FIG. 26 illustrates an X-ray diffraction spectrum, in accordance with some embodiments.

FIG. 26 illustrates an X-ray diffraction spectrum of the gate electrode 94, e.g. tungsten of the fill material 94C (see above, FIG. 24C) showing that the fill material 94C may be characterized by an amorphous phase, in accordance with some embodiments. This may be due to the use of a process gas comprising boron, e.g. diborane, used during the formation of the fill material 94C providing a smoother surface and reducing facets formed by a process gas comprising silicon, e.g. silane, during the formation of the fill material 94C (see above, FIGS. 17-23). A low smooth peak in intensity, such as around 40 degrees in the detector angle 2θ, may be present due to larger tungsten metal grains formed by the process gas comprising silicon, and the general amorphous phase of the X-ray diffraction spectrum may be due to the smoother surface formed by the process gas comprising boron. In some embodiments, the X-ray diffraction spectrum of the tungsten of the fill material 94C is free of peaks having widths less than, e.g., 5 degrees in the detector angle 2θ.

Figure 27B:
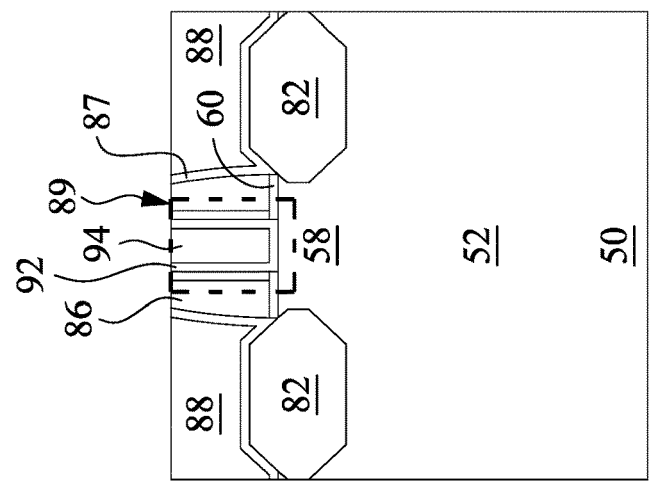
Figure 27A:
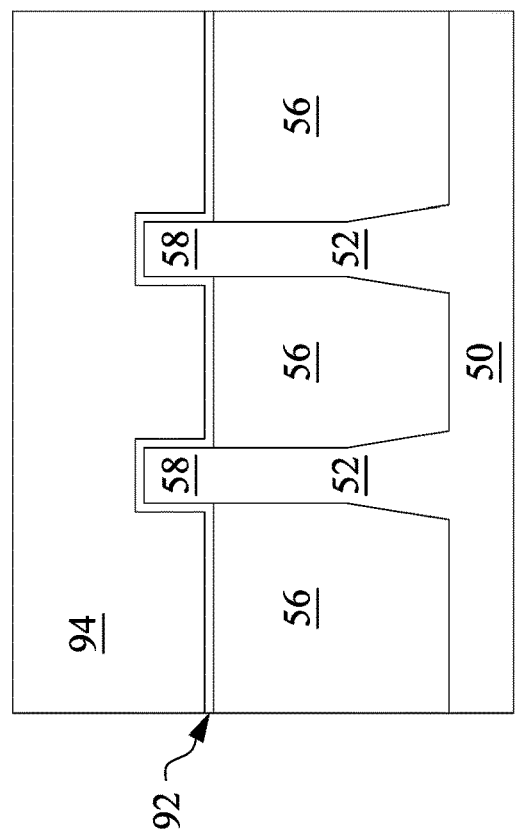
Figure 27C:
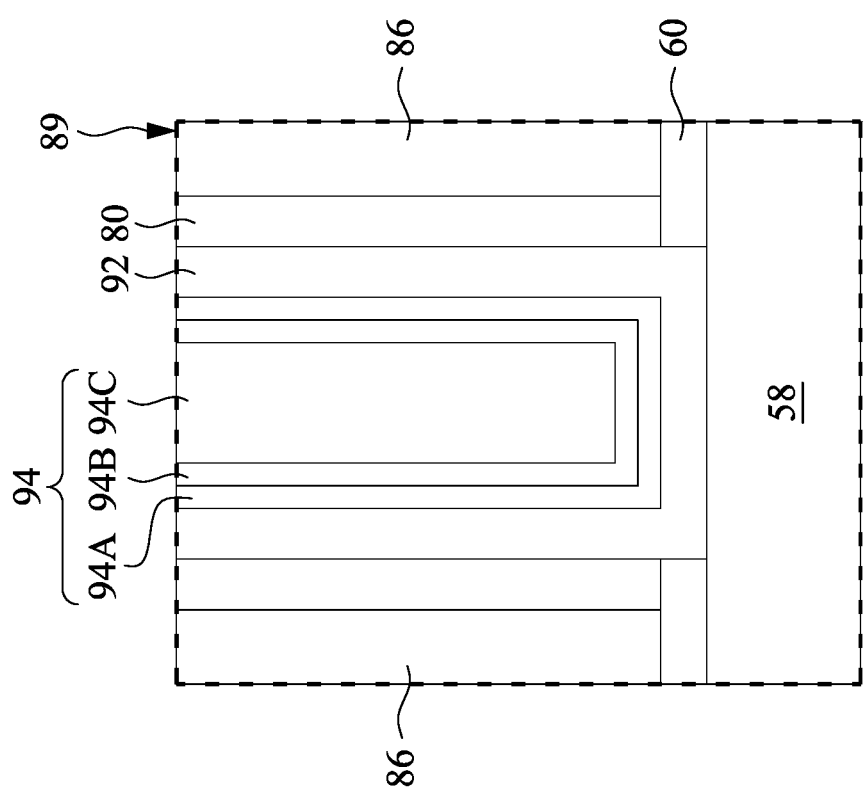

In FIGS. 27A-27C, after the filling of the recesses 90 as illustrated in FIGS. 24A-C, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate electrodes 94 may occur simultaneously in the n-type region 50N and the p-type region 50P such that the gate electrodes 94 in each region are formed from the same materials. In some embodiments, the gate electrodes 94 in each region may be formed by distinct processes, such that the gate electrodes 94 may be different materials. Various masking steps may be used to mask and expose appropriate regions when using distinct processes.

Figure 28B:
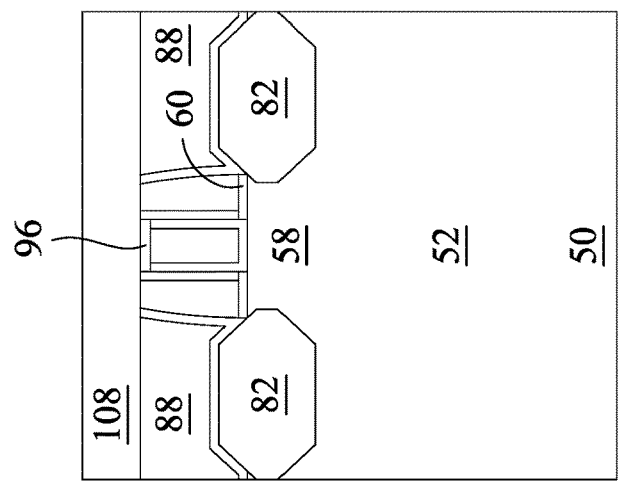
Figure 28A:
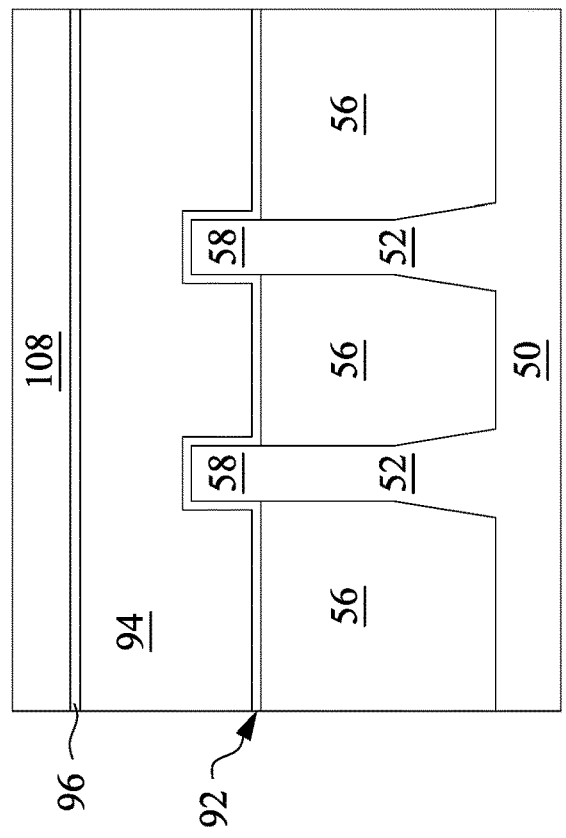

In FIGS. 28A and 28B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate stack may remain level with top surfaces of the first ILD 88.

As also illustrated in FIGS. 28A and 28B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 29A and 29B) penetrate through the second ILD 108 and the gate mask 96 (if present) to contact the top surface of the recessed gate electrode 94.

Figure 29B:
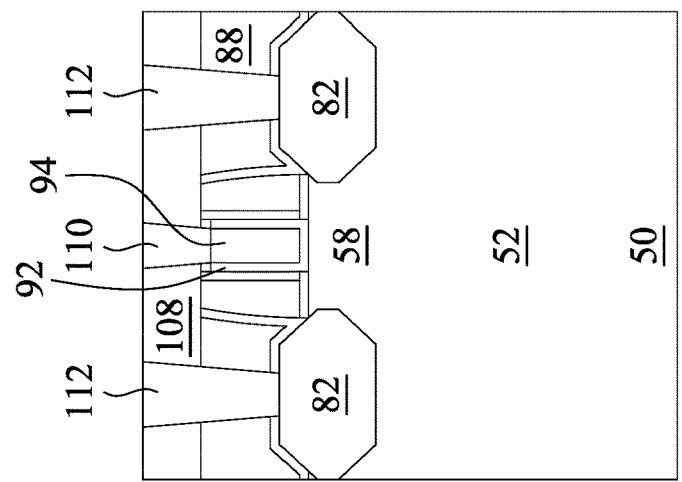
Figure 29A:
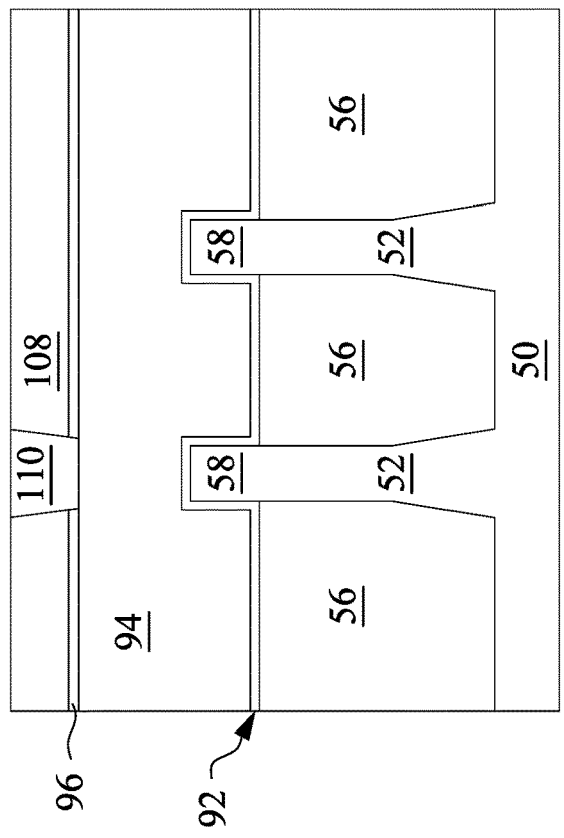

In FIGS. 29A and 29B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may provide advantages. An opening is filled with a conductive material such as tungsten with an atomic layer deposition (ALD) process. The ALD process includes alternating cycles of reacting a process gas comprising tungsten with a process gas comprising silicon and reacting a process gas comprising tungsten with a process gas comprising boron. The ALD cycle including the process gas comprising silicon produces a base nucleation layer for a tungsten film with lower resistance, providing improved device performance, and the ALD cycle including the process gas comprising boron produces a base nucleation layer for a tungsten film with a smoother surface and better gap-filling capability.

In accordance with an embodiment, a method of forming a semiconductor device includes: forming a first layer over a substrate in a deposition chamber with a first deposition cycle, the first deposition cycle including: flowing a first process gas over the substrate, the first process gas including tungsten; and flowing a second process gas over the substrate, the second process gas including boron; and forming a second layer over the substrate in the deposition chamber with a second deposition cycle, the second deposition cycle including: flowing a third process gas over the substrate, the third process gas including tungsten; and flowing a fourth process gas over the substrate, the fourth process gas including silicon. In an embodiment, the first layer is formed on the substrate and the second layer is formed on the first layer. In an embodiment, the second layer is formed on the substrate and the first layer is formed on the second layer. In an embodiment, the first process gas and the third process gas are tungsten hexafluoride. In an embodiment, the second process gas is diborane. In an embodiment, the fourth process gas is silane. In an embodiment, the method further includes the first layer and the second layer forming part of a fill material of a gate electrode. In an embodiment, the fill material has an amorphous phase. In an embodiment, an X-ray diffraction spectrum of the first layer and the second layer is free of peaks having widths less than 5 degrees in a detector angle 2θ.

In accordance with another embodiment, a method of forming a semiconductor device includes: depositing a dummy gate over a semiconductor fin; forming a source/drain region extending from a top surface of the semiconductor fin, the source/drain region being adjacent to the dummy gate; forming a dielectric layer over the source/drain, the dielectric layer being adjacent to the dummy gate; removing the dummy gate, wherein removing the dummy gate forms a recess extending through the dielectric layer; forming a gate dielectric in the recess; filling the recess with a gate electrode, the filling the recess including: depositing a first tungsten layer in the recess by performing a first atomic layer deposition (ALD) cycle, the first ALD cycle being performed using tungsten hexafluoride and silane as precursors; and depositing a second tungsten layer in the recess by performing a second ALD cycle, the second ALD cycle being performed using tungsten hexafluoride and diborane as precursors; and removing excess portions of the gate dielectric and the gate electrode. In an embodiment, filling the recess includes performing a gaseous pre-soak before performing the first ALD cycle and the second ALD cycle. In an embodiment, the gaseous pre-soak is performed with diborane or silane. In an embodiment, the first ALD cycle further includes: flowing the tungsten hexafluoride into a deposition chamber; performing a first purge of the deposition chamber with nitrogen; flowing the silane into the deposition chamber; and performing a second purge of the deposition chamber with nitrogen. In an embodiment, the flowing the tungsten hexafluoride into the deposition chamber is performed before the flowing the silane into the deposition chamber. In an embodiment, the flowing the tungsten hexafluoride into the deposition chamber is performed after the flowing the silane into the deposition chamber. In an embodiment, the first purge is performed after the flowing the tungsten hexafluoride into the deposition chamber and the second purge is performed after the flowing the silane into the deposition chamber. In an embodiment, the first purge is performed before the flowing the tungsten hexafluoride into the deposition chamber and the second purge is performed before the flowing the silane into the deposition chamber. In an embodiment, the gate electrode includes boron and silicon.

In accordance with yet another embodiment, a semiconductor device includes: a semiconductor fin extending from a substrate; a source/drain region on the semiconductor fin; and a gate stack on a channel region of the semiconductor fin, the gate stack being adjacent to the source/drain region, the gate stack including: a gate dielectric on the semiconductor fin; and a gate electrode on the gate dielectric, wherein an X-ray diffraction spectrum of the gate electrode is free of peaks having widths less than 5 degrees in a detector angle 2θ. In an embodiment, the gate electrode has a first density of boron atoms, the gate electrode has a second density of silicon atoms, and the first density is greater than the second density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a first layer over a substrate in a deposition chamber by performing a first atomic layer deposition (ALD) process, wherein performing the first ALD process comprises performing a first plurality of deposition cycles consecutively, wherein each of the first plurality of deposition cycles comprises:
   flowing a first process gas over the substrate, the first process gas comprising tungsten; and
   flowing a second process gas over the substrate, the second process gas comprising boron; and
   forming a second layer over the substrate in the deposition chamber by performing a second ALD process, wherein performing the second ALD process comprises performing a second plurality of deposition cycles consecutively, wherein each of the second plurality of deposition cycles comprises:
   flowing a third process gas over the substrate, the third process gas comprising tungsten; and
   flowing a fourth process gas over the substrate, the fourth process gas comprising silicon, wherein the first ALD process and the second ALD process are performed using different sets of process gases.

2. The method of claim 1, wherein the first layer is formed on the substrate and the second layer is formed on the first layer.

3. The method of claim 1, wherein the second layer is formed on the substrate and the first layer is formed on the second layer.

4. The method of claim 1, wherein the first process gas and the third process gas are tungsten hexafluoride.

5. The method of claim 1, wherein the second process gas is diborane.

6. The method of claim 1, wherein the fourth process gas is silane.

7. The method of claim 1, wherein the first layer and the second layer form part of a fill material of a gate electrode.

8. The method of claim 7, wherein the fill material has an amorphous phase.

9. The method of claim 1, wherein an X-ray diffraction spectrum of the first layer and the second layer is free of peaks having widths less than 5 degrees in a detector angle 2θ.

10. A method of forming a semiconductor device, the method comprising:
- depositing a dummy gate over a semiconductor fin;
- forming a source/drain region extending from a top surface of the semiconductor fin, the source/drain region being adjacent to the dummy gate;
- forming a dielectric layer over the source/drain region, the dielectric layer being adjacent to the dummy gate;
- removing the dummy gate, wherein removing the dummy gate forms a recess extending through the dielectric layer;
- forming a gate dielectric in the recess;
- filling the recess with a gate electrode, the filling the recess comprising:
    - depositing a first tungsten layer in the recess by performing a first atomic layer deposition (ALD) process that includes a first plurality of ALD deposition cycles performed consecutively, wherein each of the first plurality of ALD deposition cycles is performed using a first set of precursors that include a tungsten-containing precursor and a silicon-containing precursor; and
    - depositing a second tungsten layer in the recess by performing a second ALD process that includes a second plurality of ALD deposition cycles performed consecutively, wherein each of the second ALD deposition cycles is performed using a second set of precursors that include a tungsten-containing precursor and a boron-containing precursor, wherein the first set of precursors and the second set of precursors are different; and
- removing excess portions of the gate dielectric and the gate electrode.

11. The method of claim 10, wherein filling the recess comprises performing a gaseous pre-soak before performing the first ALD process and the second ALD process.

12. The method of claim 11, wherein the gaseous pre-soak is performed with diborane or silane.

13. The method of claim 10, wherein each of the first ALD deposition cycles is performed by:
- flowing tungsten hexafluoride into a deposition chamber;
- performing a first purge of the deposition chamber with nitrogen;
- flowing silane into the deposition chamber; and
- performing a second purge of the deposition chamber with nitrogen.

14. The method of claim 13, wherein the flowing the tungsten hexafluoride into the deposition chamber is performed before the flowing the silane into the deposition chamber.

15. The method of claim 13, wherein the first purge is performed after the flowing the tungsten hexafluoride into the deposition chamber and the second purge is performed after the flowing the silane into the deposition chamber.

16. The method of claim 13, wherein the first purge is performed before the flowing the tungsten hexafluoride into the deposition chamber and the second purge is performed before the flowing the silane into the deposition chamber.

17. The method of claim 10, wherein the gate electrode comprises boron and silicon.

18. A method of forming a semiconductor device, the method comprising:
- forming a channel region over a substrate;
- forming a dielectric layer on the channel region; and
- forming a gate electrode on the dielectric layer, wherein forming the gate electrode comprises alternately forming a first conductive layer and a second conductive layer, wherein the first conductive layer is a layer of amorphous tungsten and the second conductive layer is a layer of crystalline tungsten, wherein forming the first conductive layer comprises performing a first plurality of atomic layer deposition (ALD) cycles, wherein each of the first plurality of ALD cycles is performed using a first set of precursors that include a tungsten-containing precursor and a silicon-containing precursor, wherein forming the second conductive layer comprises performing a second plurality of ALD cycles, wherein each of the second ALD cycles is performed using a second set of precursors that include a tungsten-containing precursor and a boron-containing precursor, wherein the first set of precursors and the second set of precursors are different.

19. The method of claim 18, wherein the first conductive layer further comprises boron, and wherein the second conductive layer further comprises silicon.

20. The method of claim 13, wherein each of the second ALD deposition cycles is performed by:
- flowing tungsten hexafluoride into the deposition chamber;
- performing a first purge of the deposition chamber with nitrogen;
- flowing diborane into the deposition chamber; and
- performing a second purge of the deposition chamber with nitrogen.

* * * * *